United States Patent
Asatani et al.

(10) Patent No.: US 8,269,097 B2
(45) Date of Patent: Sep. 18, 2012

(54) THIN FILM THERMOELECTRIC ELEMENT INCLUDING STRESS RELEASING ELEMENTS

(75) Inventors: Takashi Asatani, Tokyo (JP); Fujimi Kimura, Tokyo (JP)

(73) Assignee: TDK Corporation, Tokyo (JP)

( * ) Notice: Subject to any disclaimer, the term of this patent is extended or adjusted under 35 U.S.C. 154(b) by 400 days.

(21) Appl. No.: 11/526,677

(22) Filed: Sep. 26, 2006

(65) Prior Publication Data

US 2007/0068566 A1   Mar. 29, 2007

(30) Foreign Application Priority Data

Sep. 26, 2005 (JP) ................... 2005-278097
Jun. 23, 2006 (JP) ................... 2006-174221

(51) Int. Cl.
*H01L 35/00* (2006.01)
(52) U.S. Cl. .......... 136/205; 310/306
(58) Field of Classification Search .......... 136/200–242; 62/3.2–3.6; 310/306
See application file for complete search history.

(56) References Cited

U.S. PATENT DOCUMENTS

| | | | | |
|---|---|---|---|---|
| 3,449,172 A | * | 6/1969 | Dingwall | 136/202 |
| 2002/0163079 A1 | * | 11/2002 | Awano | 257/750 |
| 2005/0211288 A1 | * | 9/2005 | Tateyama et al. | 136/212 |
| 2006/0042676 A1 | * | 3/2006 | Sogou et al. | 136/212 |
| 2006/0048809 A1 | * | 3/2006 | Onvural | 136/212 |

FOREIGN PATENT DOCUMENTS

| | | | |
|---|---|---|---|
| JP | 62145783 A | * | 6/1987 |
| JP | A-11-330567 | | 11/1999 |
| JP | A 2002-335021 | | 11/2002 |
| WO | WO 2004/001865 | * | 12/2003 |

OTHER PUBLICATIONS

English abstract of Fukada et al. JP 62145783 A published Jun. 1987.*
English translation of Fukada et al. (JP 62-145783 A), published Jun. 1987.*

* cited by examiner

*Primary Examiner* — Basia Ridley
*Assistant Examiner* — Christina Chern
(74) *Attorney, Agent, or Firm* — Oliff & Berridge, PLC

(57) ABSTRACT

A thermoelectric element has a first substrate at a high temperature side, a second substrate at a low temperature side facing the first substrate, a thermoelectric material placed on the second substrate via a silicon layer, a first electrode formed on the first substrate, and a second electrode formed on the silicon layer. The thermoelectric element has a stress releasing section which is formed between the first electrode and the thermoelectric material, and which includes a plurality of columnar portions. The stress releasing section suppresses defects such as cracks that might be produced in the thermoelectric element due to a stress generated in the thermoelectric element.

22 Claims, 16 Drawing Sheets

THIN FILM THERMOELECTRIC ELEMENT INCLUDING STRESS RELEASING ELEMENTS

BACKGROUND OF THE INVENTION

1. Field of the Invention

The present invention relates to a thermoelectric element utilizing a thermoelectric effect such as Seebeck effect, etc.

2. Description of the Related Art

Conventionally, a thermoelectric element utilizing a thermoelectric effect has been used as a power generator utilizing a temperature difference in the device, a local cooling element in a device, etc. A thermoelectric element is such an element made of semiconductor, etc., which includes a thermoelectric semiconductor, etc. whose one end is heated and whose other end is cooled in order to produce a temperature gradient in the thermoelectric semiconductor and flow an electric current between the low-temperature end and high-temperature end of the thermoelectric semiconductor by a thermoelectric effect, thereby producing a thermo-electromotive force.

A thermoelectric device disclosed in Unexamined Japanese Patent Application KOKAI Publication No. 2002-335021 employs a structure in which a plurality of thermoelectric elements are arranged between a substrate on the high-temperature side and a substrate on the low-temperature side.

SUMMARY OF THE INVENTION

For example, since the thermoelectric device disclosed in Unexamined Japanese Patent Application KOKAI Publication No. 2002-335021 has different temperatures at the substrate on the high-temperature side and at the substrate on the low-temperature side, there is a difference in the degree of how each substrate expands. Due to this difference, such defects might be caused that all the thermoelectric elements constituting the thermoelectric device are strained and cracks are produced in the thermoelectric elements, connection of the electrodes of the thermoelectric elements becomes loose, etc.

The present invention has been made in view of the above-described circumstance, and an object of the present invention is to provide a thermoelectric element capable of suppressing defects that might be caused due to a stress.

To achieve the above object, a thermoelectric element according to a first aspect of the present invention comprises:

a first substrate;

a second substrate facing the first substrate;

a thermoelectric material placed between the first substrate and the second substrate, which generates a thermo-electromotive force by a temperature gradient;

a first electrode electrically connected to a high temperature portion of the thermoelectric material;

a second electrode electrically connected to a low temperature portion of the thermoelectric material; and at least one or more stress releasing section(s) having flexibility, which thermally connect(s) the first electrode and the thermoelectric material.

To achieve the above object, a thermoelectric element according to a second aspect of the present invention comprises:

a first substrate;

a second substrate facing the first substrate;

a thermoelectric material placed between the first substrate and the second substrate, which generates a thermo-electromotive force by a temperature gradient;

a first electrode electrically connected to a low temperature portion of the thermoelectric material;

a second electrode electrically connected to a high temperature portion of the thermoelectric material; and at least one or more stress releasing section(s) having flexibility, which thermally connect(s) the first electrode and the thermoelectric material.

To achieve the above object, a thermoelectric element according to a third aspect of the present invention comprises:

a first substrate;

a second substrate facing the first substrate;

a thermoelectric material placed between the first substrate and the second substrate, which generates heat transfer by an electric current;

a first electrode electrically connected to a heat absorbing portion of the thermoelectric material;

a second electrode electrically connected to a heat generating portion of the thermoelectric material; and at least one or more stress releasing section(s) having flexibility, which thermally connect(s) the first electrode and the thermoelectric material.

To achieve the above object, a thermoelectric element according to a fourth aspect of the present invention comprises:

a first substrate;

a second substrate facing the first substrate;

a thermoelectric material placed between the first substrate and the second substrate, which generates heat transfer by an electric current;

a first electrode electrically connected to a heat generating portion of the thermoelectric material;

a second electrode electrically connected to a heat absorbing portion of the thermoelectric material; and at least one or more stress releasing section(s) having flexibility, which thermally connect(s) the first electrode and the thermoelectric material.

To achieve the above object, a thermoelectric element according to a fifth aspect of the present invention comprises:

a first substrate;

a second substrate facing the first substrate;

a thermoelectric material placed between the first substrate and the second substrate, which generates a thermo-electromotive force by a temperature gradient;

a first electrode formed on a surface of the first substrate that faces the second substrate;

a second electrode electrically connected to the thermoelectric material and electrically connected to the first electrode via the thermoelectric material; and a stress releasing section comprising at least one or more columnar portion(s), which is formed between the first electrode and the thermoelectric material and which electrically connects the first electrode and the thermoelectric material.

The thermoelectric material may be a thin film, a supporter for supporting the thermoelectric material may be placed at a circumferential portion of the thermoelectric material, and the supporter may be formed into a frame shape so as to be able to support the thermoelectric material.

The thermoelectric material may be placed on the second substrate via a spacer, a lower electrode may be formed on the second substrate, and the second electrode and the lower electrode may be electrically connected.

The thermoelectric material may be placed on the second substrate via a spacer, and the spacer may be movably placed on the second substrate.

The thermoelectric material may be a thin film, and the spacer may be formed into a frame shape, placed at a circumferential portion of the thermoelectric material, and support the thermoelectric material as a supporter.

At least a part of the stress releasing section(s) having flexibility may be made of carbon nanotube.

The thermoelectric element may further comprise at least one or more second stress releasing section(s) having flexibility, between the thermoelectric material and the second substrate.

The second stress releasing section(s) may comprise a columnar portion.

The thermoelectric material may comprise a plurality of N type and P type thermoelectric materials, the first electrode and the second electrode may be connected to each of the thermoelectric materials, the N type thermoelectric materials and the P type thermoelectric materials may be arranged alternately, and the first electrode connected to any N type thermoelectric material and the first electrode connected to the P type thermoelectric material adjacent to one end of the N type thermoelectric material may be electrically connected and the second electrode connected to the N type thermoelectric material and the second electrode connected to the P type thermoelectric material adjacent to the other end of the N type thermoelectric material may be electrically connected such that the N type thermoelectric materials and the P type thermoelectric materials are in series connection.

The thermoelectric element may further comprise a sealing section which shields the thermoelectric material from external air.

The sealing section may be made of superelastic metal.

The thermoelectric element may further comprise a heat collecting plate placed on the first substrate and/or the second substrate, and having a larger area than that of the thermoelectric material.

The thermoelectric element may comprise a stress releasing section between the heat collecting plate placed on the first substrate and the first substrate, and/or between the heat collecting plate placed on the second substrate and the second substrate.

At least a part of the stress releasing section may be made of carbon nanotube.

To achieve the above object, a thermoelectric element according to a sixth aspect of the present invention comprises:
a first substrate;
a second substrate facing the first substrate;
a thermoelectric material which is placed between the first substrate and the second substrate, and to which a first electrode formed on the first substrate located at a higher temperature side than the second substrate is located, and a second electrode formed on the second substrate are electrically connected; and
at least one or more stress releasing section(s) which is(are) connected to the first electrode and the thermoelectric material, which thermally connect(s) the first substrate on which the first electrode is formed and the thermoelectric material, and which deform(s) itself (themselves) in proportion to displacement of the first substrate to release a stress caused upon the thermoelectric material.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A thermoelectric element according to the embodiments of the present invention will be explained using the drawings.

(First Embodiment)

Figure 1:
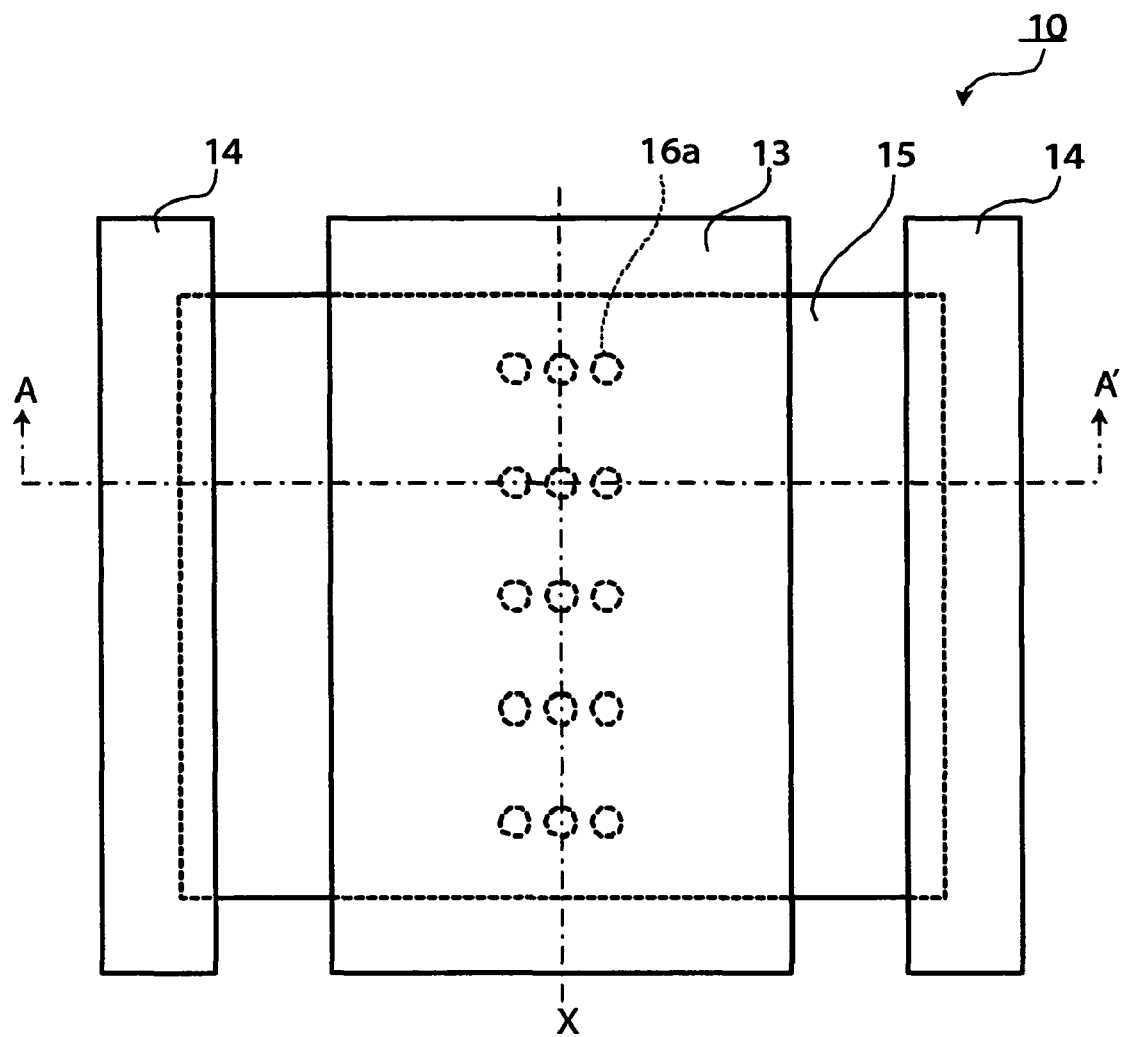
FIG. 1 is a plan view showing an example of the structure of a thermoelectric element according to a first embodiment of the present invention.
Figure 2:
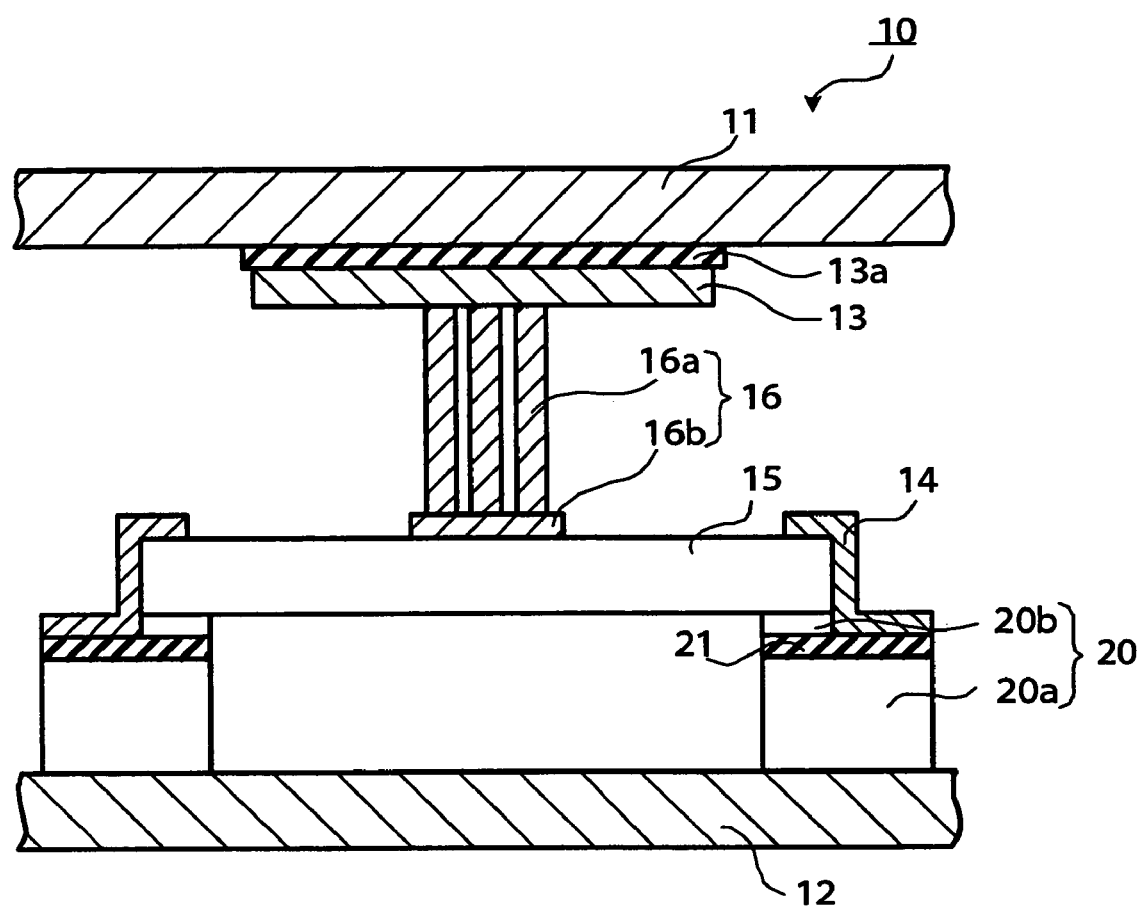
FIG. 2 is a cross sectional view of the thermoelectric element shown in FIG. 1 as taken along a line A-A'.

A thermoelectric element 10 according to the first embodiment of the present invention is shown in FIG. 1 and FIG. 2. For easier understanding, a first substrate 11 and a second substrate 12 shown in FIG. 2 are omitted in FIG. 1.

As shown in FIG. 1 and FIG. 2, the thermoelectric element 10 comprises a first substrate 11, a second substrate 12, a first electrode 13, a second electrode 14, a thermoelectric material 15, a stress releasing section 16, a silicon layer 20, and an insulating layer 21.

Since the first substrate 11 comes to have a high temperature upon receiving heat conducted from a high-temperature heat source (unillustrated), it is preferably made of a material having a small linear coefficient of expansion in order to suppress occurrence of a stress that might be produced in the first substrate 11, and made of, for example, invar alloy, or the like. The high-temperature heat source (unillustrated) is placed above the first substrate 11, and the first electrode 13 is formed on the lower surface of the first substrate 11 via an insulating layer 13a. The first substrate 11 may be made of glass having a small linear coefficient of expansion. Furthermore, the first substrate 11 may be made of a material in which glass or the like having a small linear coefficient of expansion and a material having a favorable heat conductance are combined.

The second substrate 12 is made of, for example, invar alloy likewise the first substrate 11. A cooling system (unillustrated) is placed under the second substrate 12 and keeps both the ends of the thermoelectric material 15 at a low temperature via the silicon layer 20, etc. The silicon layer 20 is disposed in a free-to-move state on the upper surface of the second substrate 12 via an adhesive layer (unillustrated) made of organic grease or the like. Indium-gallium alloy or the like may be used as the adhesive layer.

The first electrode 13 is made of a conductive material such as copper or the like, and formed on the lower surface of the first substrate 11 via the insulating layer 13a as shown in FIG. 2. The insulating layer 13a insulates the first substrate 11 and the first electrode 13. The insulating layer 13a is needed only in a case where the first substrate 11 is made of a conductive material, thus can be omitted in a case where the first substrate 11 is made of an insulative material. The stress releasing section 16 is placed on the lower surface of the first electrode 13. When the first substrate 11 is heated by the high-temperature heat source, heat conductance is produced from the first electrode 13 to the thermoelectric material 15 via the stress releasing section 16, etc. As will be described later, in a case where the thermoelectric material 15 is made of N type thin-film superlattice thermoelectric semiconductor, the first electrode 13 functions as a positive electrode.

The second electrode 14 is made of a conductive material, such as, for example, copper or the like. The second electrode 14 is formed on both ends of the thermoelectric material 15 so as to cover the side surfaces and partially the upper surface of the thermoelectric material 15, and the insulating layer 21. The second electrode 14 functions as a negative electrode, in a case where the thermoelectric material 15 is made of N type thin-film superlattice thermoelectric semiconductor.

The thermoelectric material 15 is made of N type thin-film superlattice thermoelectric semiconductor comprising, for example, SiGe/Si. The stress releasing section 16 is formed at the center of the thermoelectric material 15 as shown in FIG. 1, and the silicon layer 20 is formed at both ends of the thermoelectric material 15. Thus, when the first substrate 11 is heated and the second substrate 12 is cooled, the temperature at the center of the thermoelectric material 15 becomes high and the temperature at both ends of the thermoelectric material 15 becomes low. In this manner, temperature gradients are produced in two directions from the center of the thermoelectric material 15 to both ends thereof. A thermoelectric effect due to these temperature gradients produces a potential difference between the high temperature portion and low temperature portion of the thermoelectric material 15.

The stress releasing section 16 comprises a plurality of columnar portions 16a having a columnar shape and a circular cross-sectional shape, and a flat plate portion 16b whose plan-view shape is generally rectangular. The stress releasing section 16 is formed along a center line X of the thermoelectric material 15 as shown in FIG. 1, and the columnar portions 16a are formed between the first electrode 13 and the flat plate portion 16b as shown in FIG. 2. Since the columnar portions 16a are formed between the first electrode 13 and the thermoelectric material 15, it is preferred that they be made of a material having a high conductivity and a high heat conductance, and also having flexibility for absorbing displacement, and they are made of, for example, copper, copper alloy, carbon nanotube, or the like.

The stress releasing section 16 prevents the thermoelectric element 10 from causing operation failures, due to cracks produced in the thermoelectric element 10, loose connection between the electrodes, etc. which might be caused by a stress produced in the thermoelectric element 10, for example, strain or the like that occurs due to the difference in the degree of expansion between the first substrate 11 and the second substrate 12. Hence, it is preferred that the stress releasing section 16 be formed into a shape easily deformable by a stress, and that it be formed into a columnar shape. The cross-sectional shape of the columnar portions 16a is not limited to a circle, but may be a rectangle or a polygon.

The silicon layer 20 is preferably made of a material excellent in heat conductance so that both ends of the thermoelectric material 15 are favorably cooled to a low temperature by the cooling system, and made of silicon according to the present embodiment. The silicon layer 20 comprises a first silicon layer 20a placed on the second substrate 12 and a second silicon layer 20b formed between the thermoelectric material 15 and the insulating layer 21, and functions as a spacer. An adhesive layer made of organic grease or the like is formed between the first silicon layer 20a and the second substrate 12, such that the silicon layer 20 is placed so as to be movable on the second substrate 12. Thus, even when, for example, the first substrate 11 expands due to heat, the silicon layer 20 can adequately change its position in proportion to the deformation of the first substrate 11. Since this enables the silicon layer 20 to disperse the force concentrated on the thermoelectric material 15, the second electrode 14, etc., and prevent the stress from excessively focusing on the stress releasing section 16, defects that might occur in the thermoelectric element 10 can further favorably be suppressed.

The insulating layer 21 is made of an insulative material, such as, for example, a silicon oxide film or the like. The insulating layer 21 is formed between the first silicon layer 20a and the second silicon layer 20b. The second electrode 14 is formed on the insulating layer 21, and the insulating layer 21 insulates the second electrode 14 and the silicon layer 20.

A sealing section (unillustrated) made of a material having a low heat conductance is formed between the first substrate 11 and the second substrate 12 so as to surround the thermoelectric material 15, the stress releasing section 16, etc. The space between the first substrate 11 and the second substrate 12 is vacuum-sealed by the sealing section. Being vacuum-sealed, the first substrate 11 and the second substrate 12 are thermally insulated from each other finely.

The thermoelectric element 10 having the above-described structure comprises the stress releasing section 16. Because of this, even when, for example, the first substrate 11 is heated and the second substrate 12 is cooled thereby a difference in displacement is caused between the first substrate 11 and the second substrate 12, the deformation of the stress releasing section 16 because of its flexibility can absorb the difference in displacement, making it possible to suppress occurrence of cracks in the thermoelectric material 15, etc.

Further, particularly, the thermoelectric element 10 has its silicon layer 20 placed movably by means of organic grease. Thus, as compared with a case where only the stress releasing section 16 is prepared, the thermoelectric element 10 can further absorb the displacements in the horizontal direction and suppress defects that might be caused therein. As described above, according to the present invention, it is possible to provide a thermoelectric element capable of favorably suppressing defects due to a stress.

The thermoelectric element 10 may not only made by using an N type superlattice thermoelectric material, but may be made by using a P type superlattice thermoelectric material such as, for example, B4C/B9C, etc.

The thermoelectric element 10 may not only be used solely, but also used for forming a thermoelectric device in which a plurality of the thermoelectric element 10 shown in FIG. 1 and FIG. 2 are connected in parallel or in series. Further, it is also possible to build a thermoelectric device by alternately connecting a thermoelectric element in which a P type superlattice thermoelectric material is used as the thermoelectric material, and a thermoelectric element in which an N type superlattice thermoelectric material is used as the thermoelectric material. These schemes may be arbitrarily combined.

(Second Embodiment)

Figure 3:
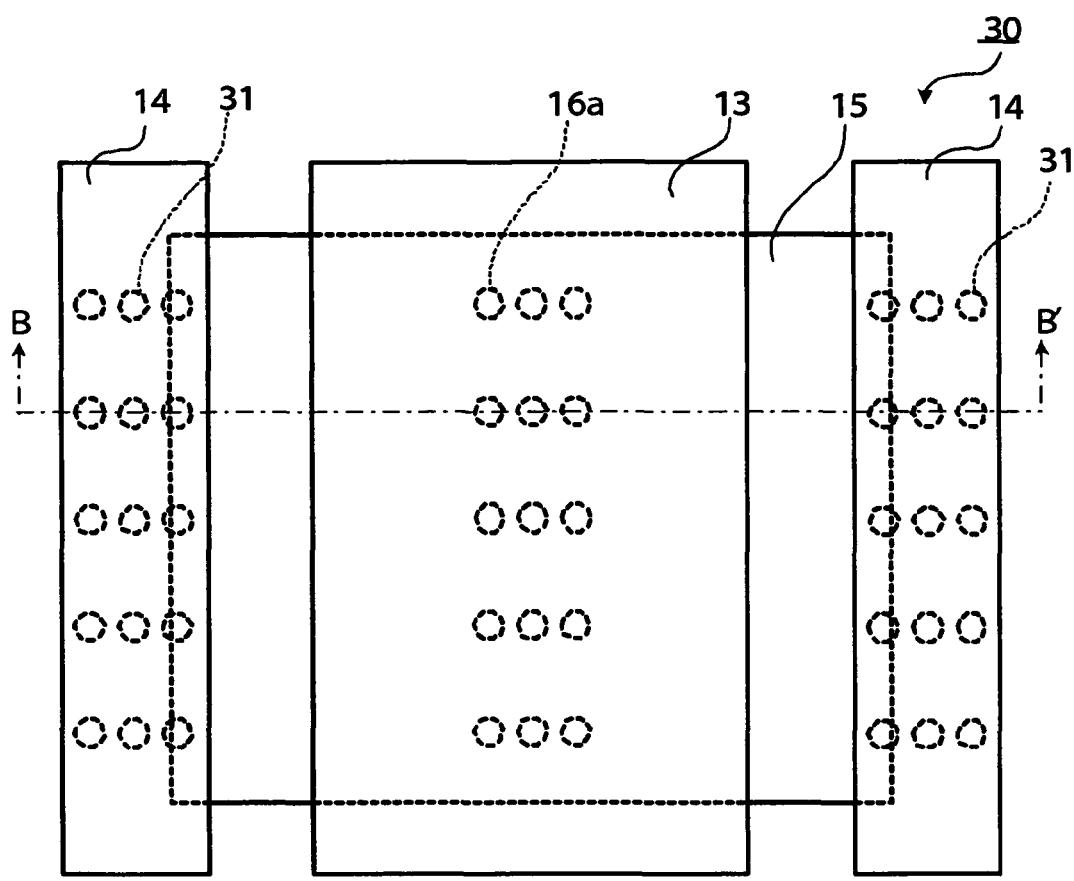
FIG. 3 is a plan view showing an example of the structure of a thermoelectric element according to a second embodiment of the present invention.
Figure 4:
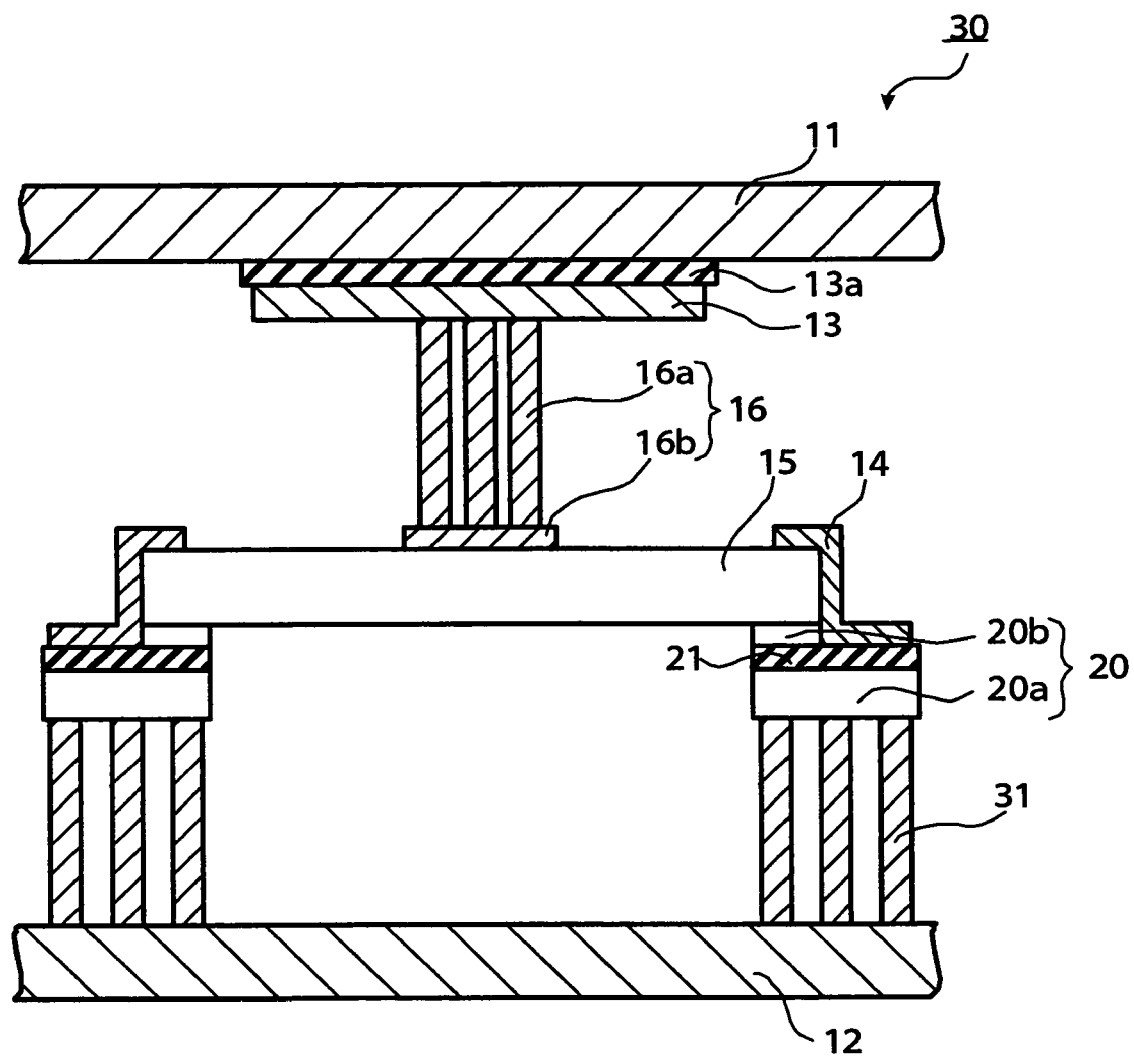
FIG. 4 is a cross sectional view of the thermoelectric element shown in FIG. 3 as taken along a line B-B'.

A thermoelectric element 30 according to the second embodiment of the present invention is shown in FIG. 3 and FIG. 4. The thermoelectric element 30 according to the present embodiment is different from the thermoelectric element 10 according to the first element in that a second stress releasing section 31 for releasing a stress is also provided between the second substrate 12 and the silicon layer 20. Those components that are the same as those in the first embodiment will be denoted by the same reference numerals and a detailed explanation for such components will be omitted.

As shown in FIG. 3 and FIG. 4, the thermoelectric element 30 comprises a first substrate 11, a second substrate 12, a first electrode 13, a second electrode 14, a thermoelectric material 15, a stress releasing section 16, a silicon layer 20, an insulating layer 21, and a second stress releasing section 31.

The second stress releasing section 31 is formed between the second substrate 12 and the silicon layer 20. Likewise the stress releasing section 16, the second stress releasing section 31 is preferably made of a material having a high heat conductance, and made of, for example, copper, copper alloy, carbon nanotube, or the like. The second stress releasing section 31 comprises a plurality of columnar portions having a columnar shape and a circular cross-sectional shape. Unlike the first embodiment, no adhesive layer made of grease or the like is formed between the second stress releasing section 31 and the second substrate 12, thus the second stress releasing section 31 is fixed on the second substrate 12.

The thermoelectric element 30 according to the present embodiment comprises the second stress releasing section 31 between the second substrate 12 and the silicon layer 20. Thus, even when there is caused a difference in displacement between the first substrate 11 and the second substrate 12 due to a difference in linear coefficient of expansion, etc., such as when, for example, the first substrate 11 is heated while the second substrate 12 is cooled and shrunk, the stress releasing section 16 and the second stress releasing section 31 can absorb the difference in displacement by deforming themselves, making it possible to suppress occurrence of cracks in the thermoelectric material 15, etc.

(Third Embodiment)

Figure 5:
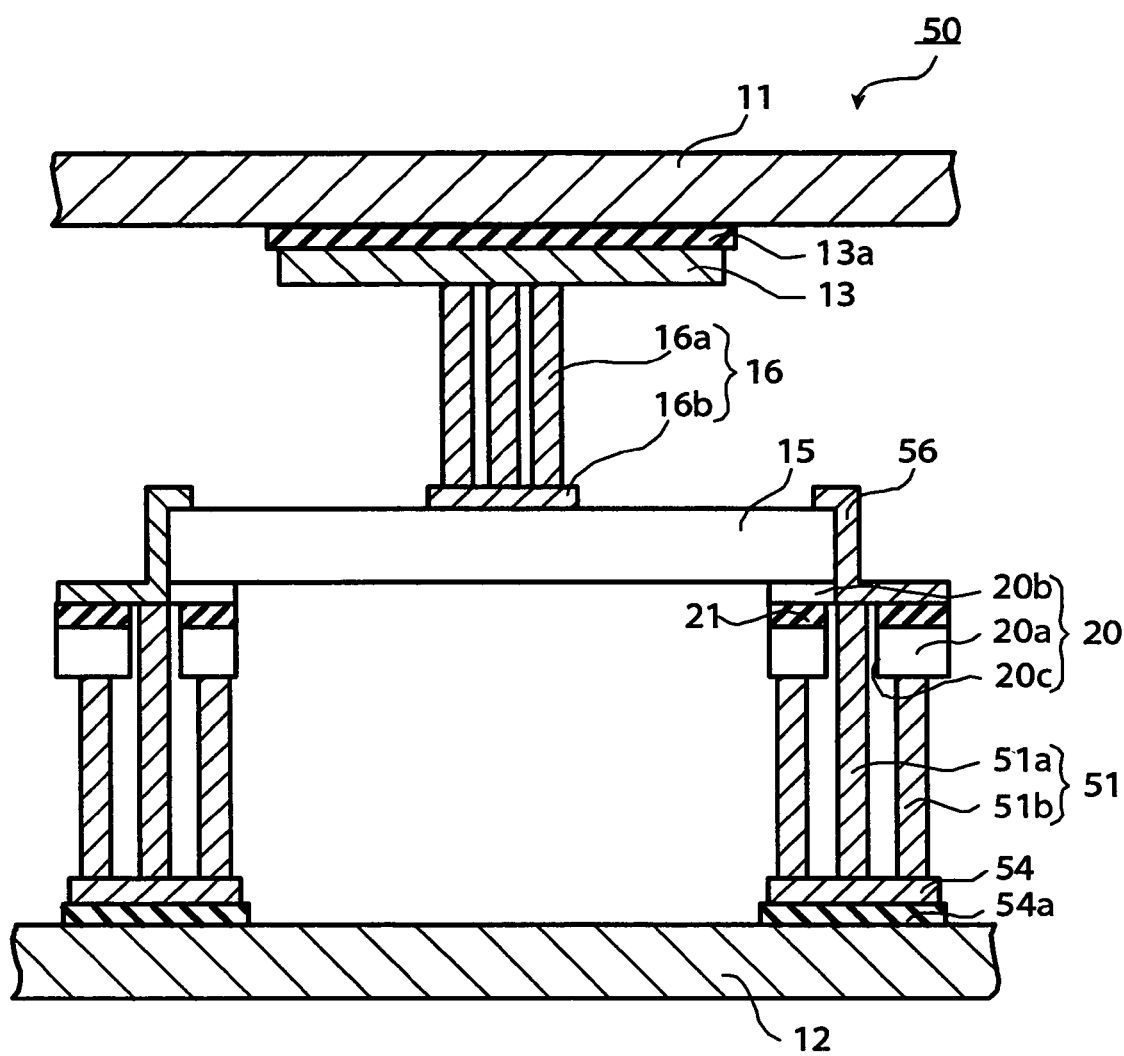
FIG. 5 is a cross sectional view showing an example of the structure of a thermoelectric element according to a third embodiment of the present invention.

A thermoelectric element 50 according to the third embodiment of the present embodiment is shown in FIG. 5. The thermoelectric element 50 according to the present embodiment is different from the thermoelectric element 10 and the thermoelectric element 30 in that the silicon layer 20 has an opening 20c, and a part of a third stress releasing section 51 is formed between an electrode 56 and a second electrode 54. Those components that are the same as those in the first embodiment and second embodiment described above will be denoted by the same reference numerals, and a detailed explanation for such components will be omitted.

As shown in FIG. 5, the thermoelectric element 50 according to the present embodiment comprises a first substrate 11, a second substrate 12, a first electrode 13, a second electrode 54, a thermoelectric material 15, a stress releasing section 16, an electrode 56, a silicon layer 20, an insulating layer 21, and a third stress releasing section 51.

Likewise the first embodiment and the second embodiment, the third stress releasing section 51 is preferably made of a material excellent n heat conductance, and made of, for example, copper, carbon nanotube, copper alloy, or the like. As shown in FIG. 5, the third stress releasing section 51 comprises a columnar portion 51a placed between the electrode 56 and the second electrode 54 through the opening 20c formed in the silicon layer 20, and columnar portions 51b placed between the silicon layer 20 and the second electrode 54. The columnar portions 51a and 51b are both have a circular cross-sectional shape. By the columnar portion 51a being connected to the thermoelectric material 15 via the electrode 56, a difference in displacement between the first substrate 11 and the second substrate 12 caused by heat can further effectively absorbed. The columnar portions 51a and 51b may be formed into not only a circle, but a rectangle or a polygon. The diameter of the columnar portions 51a and 51b may be equal or may be different. For example, the columnar portion 51a may have a larger diameter.

The second electrode 54 is formed on the second substrate 12 via an insulating layer 54a. The columnar portions 51a and 51b of the third stress releasing section 51 are formed on the second electrode 54. The insulating layer 54a is needed in a case where the second substrate 12 is made of a conductive material, and can be omitted in a case where, for example, the second substrate 12 is made of an insulative material.

The silicon layer 20 has the opening 20c, which is formed to penetrate the first silicon layer 20a and second silicon layer 20b.

As described above, the thermoelectric element 50 according to the present embodiment has the columnar portion 51a connected to the thermoelectric element 15 via the electrode 56. Thus, even when there is caused a difference in displacement between the first substrate 11 and the second substrate 12 due to a difference in thermal expansion, etc., such as when, for example, the first substrate 11 is heated while the second substrate 12 is cooled and shrunk, the stress releasing section 16 and the third stress releasing section 51 can absorb the difference in displacement by deforming themselves, making it possible to suppress occurrence of cracks in the thermoelectric material 15, etc. Particularly, since the columnar portion 51a is connected to the thermoelectric material 15 via the electrode 56, displacements can further preferably absorbed.

(Fourth Embodiment)

Figure 6A:
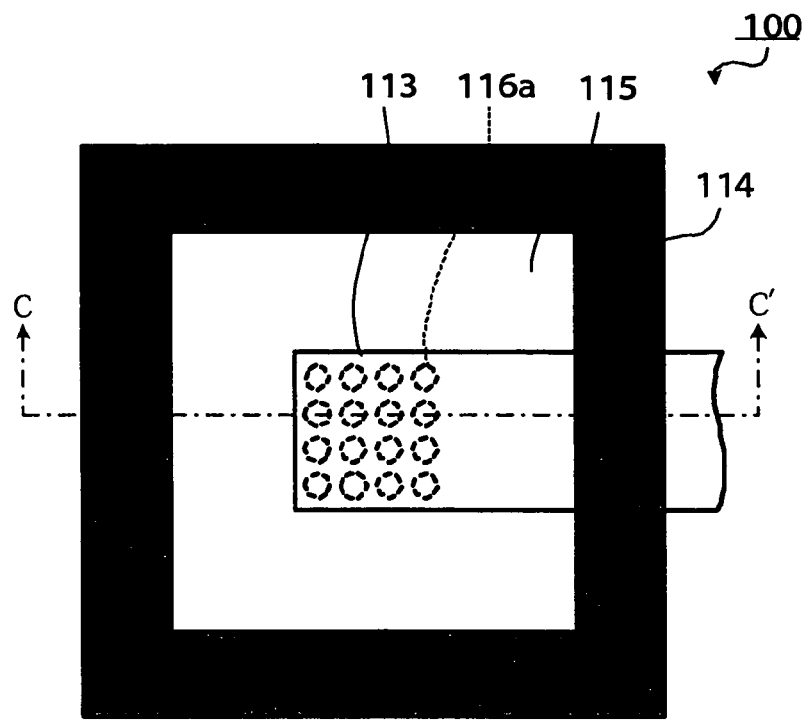
FIG. 6A is a plan view showing an example of a structure of a thermoelectric element according to a fourth embodiment of the present invention.
Figure 6B:
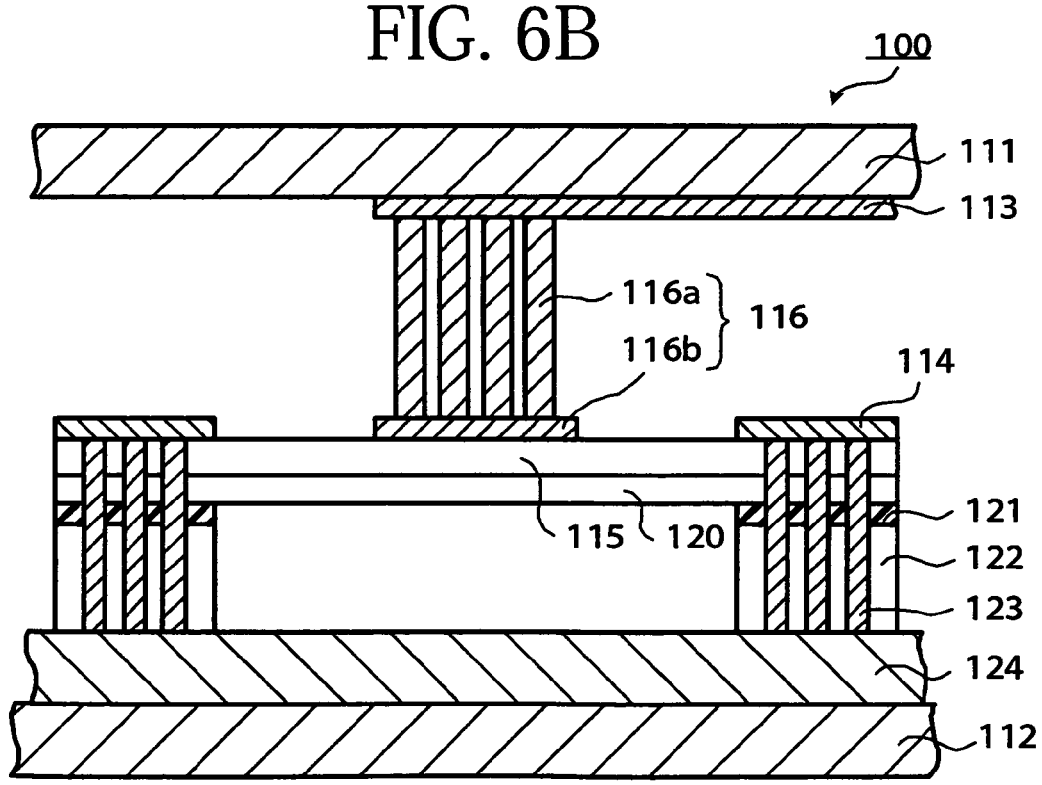
FIG. 6B is a cross sectional view of the thermoelectric element shown in FIG. 6A as taken along a line C-C'.

A thermoelectric element 100 according to the fourth embodiment of the present invention is shown in FIGS. 6A and 6B.

As shown in FIGS. 6A and 6B, a thermoelectric element 100 according to the present embodiment comprises a first substrate 111, a second substrate 112, a first electrode 113, a second electrode 114, a thermoelectric material 115, a stress releasing section 116, an SG layer 120, an insulating layer 121, a silicon layer 122, penetrating electrodes 123, and a lower electrode 124.

Since the first substrate 111 comes to have a high temperature upon receiving heat conducted from a high-temperature heat source (unillustrated), it is preferably made of a material having a small linear coefficient of expansion in order to suppress occurrence of a stress that might be produced in the first substrate 111, and made of, for example, invar alloy, or the like. The high-temperature heat source (unillustrated) is placed above the first substrate 111, and the first electrode 113 is formed on the lower surface of the first substrate 111 via an insulating layer (unillustrated). The first substrate 111 may be made of glass having a small linear coefficient of expansion. Further, the first substrate 111 may be made of a material in which glass or the like having a small linear coefficient of expansion and a material having a favorable heat conductance are combined.

The second substrate 112 is made of, for example, invar alloy likewise the first substrate 111. The lower side of the second substrate 112 is exposed to the atmosphere, or a cooling system (unillustrated) is placed there, so that the peripheral region of the thermoelectric material 115 may be kept at a low temperature via the SG layer 120, the insulating layer 121, the silicon layer 122, the penetrating electrodes 123, and the lower electrode 124, and a temperature gradient may be produced between the peripheral region and center region of the thermoelectric material 115. The lower electrode 124 is placed on the upper surface of the second substrate 112 via an insulating layer (unillustrated).

The first electrode 113 is made of a conductive material such as, for example, copper or the like, and placed on the lower surface of the first substrate 111 via an insulating layer (unillustrated) as shown in FIG. 6B. The insulating layer insulates the first substrate 111 from the first electrode 113. The insulating layer is needed only in a case where the first substrate 111 is made of a conductive material, and can be omitted in a case where the first substrate 111 is made of an insulative material. The stress releasing section 116 is placed on the lower surface of the first electrode 113. When the first substrate 111 is heated by the high-temperature heat source, heat is conducted from the first electrode 113 to the thermoelectric material 115 via the stress releasing section 116, etc. Further, as will be described later, in a case where the thermoelectric material 115 is made of N type thin-film superlattice thermoelectric semiconductor, the first electrode 113 functions as a positive electrode.

The second electrode 114 is made of a conductive material such as, for example, copper or the like. The second electrode 114 is placed on the peripheral region of the thermoelectric material 115 so as to cover the edges of the thermoelectric material 115 as shown in FIG. 6A. In a case where the thermoelectric material 115 is made of N type thin-film superlattice thermoelectric semiconductor, the second electrode 114 functions as a negative electrode.

The thermoelectric material 115 is made of, for example, N type thin-film super lattice thermoelectric semiconductor comprising SiGe/Si. As shown in FIG. 6A, the stress releasing section 116 is formed at the center region of the thermoelectric material 115, and the second electrode 114 is formed at the peripheral region of the thermoelectric material 115. Thus, when the first substrate 111 is heated and the second substrate 112 is cooled, the temperature at the center region of the thermoelectric material 115 gets high, and the temperature at the peripheral region of the thermoelectric material 115 gets low. In this manner, a temperature gradient is produced from the center region of the thermoelectric material 115 to the peripheral region thereof. A potential difference is produced between the high temperature portion of the thermoelectric material 115 and the low temperature portion thereof, due to a thermoelectric effect caused by the temperature gradient.

The stress releasing section 116 comprises a plurality of columnar portions 116a having a columnar shape and a circular cross-sectional shape, and a flat plate portion 116b whose plan-view shape is generally rectangular. The columnar portions 116a of the stress releasing section 116 are formed plurally at the center region of the thermoelectric material 115 within a generally rectangular range as shown in FIG. 6A, and formed between the first electrode 113 and the thermoelectric material 115 as shown in FIG. 6B. Since the stress releasing section 116 is formed between the first electrode 113 and the thermoelectric material 115, it is preferred that it be made of a material having a high conductivity and a high heat conductance, and also having flexibility for absorbing displacement, and it is made of, for example, copper, copper alloy, carbon nanotube, or the like.

The stress releasing section 116 prevents the thermoelectric element 100 from causing operation failures, due to cracks produced in the thermoelectric element 100, loose connection between the electrodes, etc. which might be caused by a stress produced in the thermoelectric element 100, for example, strain or the like that occurs due to the difference in the degree of expansion between the first substrate 111 and the second substrate 112. Hence, it is preferred that the stress releasing section 116 be formed into a shape easily deformable by a stress, and that it be formed into a columnar shape. The cross-sectional shape of the columnar portions 116a is not limited to a circle, but may be a rectangle, a polygon, an ellipse, or the like.

The SG layer 120 is made of, for example, SiGe. The thermoelectric material 115 made of a superlattice thermoelectric material comprising, for example, an SiGe/Si layer is formed on the upper surface of the SG layer 120. The SG layer 120 may be made not only of SiGe, but of Si. SiGe constituting the SG layer 120 is preferable because it has a low heat conductance and allows little heat loss, thus does not reduce the heat generation efficiency of the thermoelectric material 115.

The insulating layer 121 is made of an insulative material, such as, for example, a silicon oxide film or the like. The insulating layer 121 is formed between the SG layer 120 and the silicon layer 122. The insulating layer 121 is formed to have a plan-view shape which is generally an annular rectangle. The insulating layer 121 functions as a stop layer for protecting the thermoelectric material 115 from being etched when the silicon layer 122 is processed. Accordingly, the insulating layer 121 can be omitted in a case where a sufficiently high processing precision can be secured without using it.

The silicon layer 122 is preferably made of a material excellent in heat conductance so that the peripheral region of the thermoelectric material 115 may be favorably cooled to a low temperature by the cooling system, made of silicon according to the present embodiment. The silicon layer 122 is fixed on the lower electrode 124. The silicon layer 122 and the insulating layer 121 function as a spacer. Further, the silicon layer 122 also serves to prevent the breakage of the thermoelectric material 115 as a frame for supporting the thermoelectric material 115, in a case where the thermoelectric material 115 and the SG layer 120 are thinly formed and only the thermoelectric material 115 and SG layer 120 themselves without the silicon layer 122 cannot have a sufficient strength to resist forces applied when the device is processed or mounted. With the silicon layer 122, it becomes possible to use, as the thermoelectric material 115, a thermoelectric material which has a high performance but can be obtained only in the form of a thin film, such as superlattice thermoelectric material such as SiGe/Si, B4C/B9C, etc. which can be formed only by thin film formation techniques. Hence, it becomes possible to build a thermoelectric element having a high performance.

The penetrating electrodes 123 are made of a conductive material such as, for example, copper or the like, and formed to penetrate through the SG layer 120, the insulating layer 121, and the silicon layer 122. The second electrode 114 and the lower electrode 124 are electrically connected by the penetrating electrodes 123. Heat is conducted between the second substrate 112 and the second electrode 114 through the penetrating electrodes 123, or through the SG layer 120, the insulating layer 121, and the silicon layer 122, so that the peripheral region of the thermoelectric material 115 may be kept at a lower temperature than the center region thereof and a temperature gradient may be produced in the thermoelectric material 115.

The lower electrode 124 is made of a conductive material such as, for example, copper or the like, and formed on the upper surface of the second substrate 112. The silicon layer 122 is placed on the lower electrode 124.

A sealing section (unillustrated) made of a material having a low heat conductance is formed between the first substrate 111 and the second substrate 112 so as to surround the thermoelectric material 115, the stress releasing section 116, etc. The space between the first substrate 11 and the second substrate 12 is vacuum-sealed by the sealing section. Being vacuum-sealed, the first substrate 111 and the second substrate 112 are thermally insulated from each other finely.

The thermoelectric element 100 having the above-described structure comprises the stress releasing section 116 formed at the center region of the thermoelectric material 115. Therefore, even when, for example, the first substrate 111 is heated and the second substrate 112 is cooled, and a difference occurs in the displacement of the first substrate 111 and that of the second substrate 112 due to a difference in thermal expansion, etc., the stress releasing section 116 can absorb the difference in the displacement by deforming itself and can therefore suppress occurrence of cracks in the thermoelectric material 115, etc.

The thermoelectric element 100 may be made by using not only an N type superlattice thermoelectric material, but also a P type superlattice thermoelectric material such as, for example, B4C/B9C, etc.

Furthermore, the thermoelectric element 100 may not only be used solely, but also used for forming a thermoelectric device in which a plurality of the thermoelectric element 100 shown in FIGS. 6A and 6B are connected in parallel or in series. Further, it is also possible to build a thermoelectric device by alternately connecting a thermoelectric element in which a P type superlattice thermoelectric material is used as the thermoelectric material, and a thermoelectric element in which an N type superlattice thermoelectric material is used as the thermoelectric material. These schemes may be arbitrarily combined.

(Fifth Embodiment)

Figure 7:
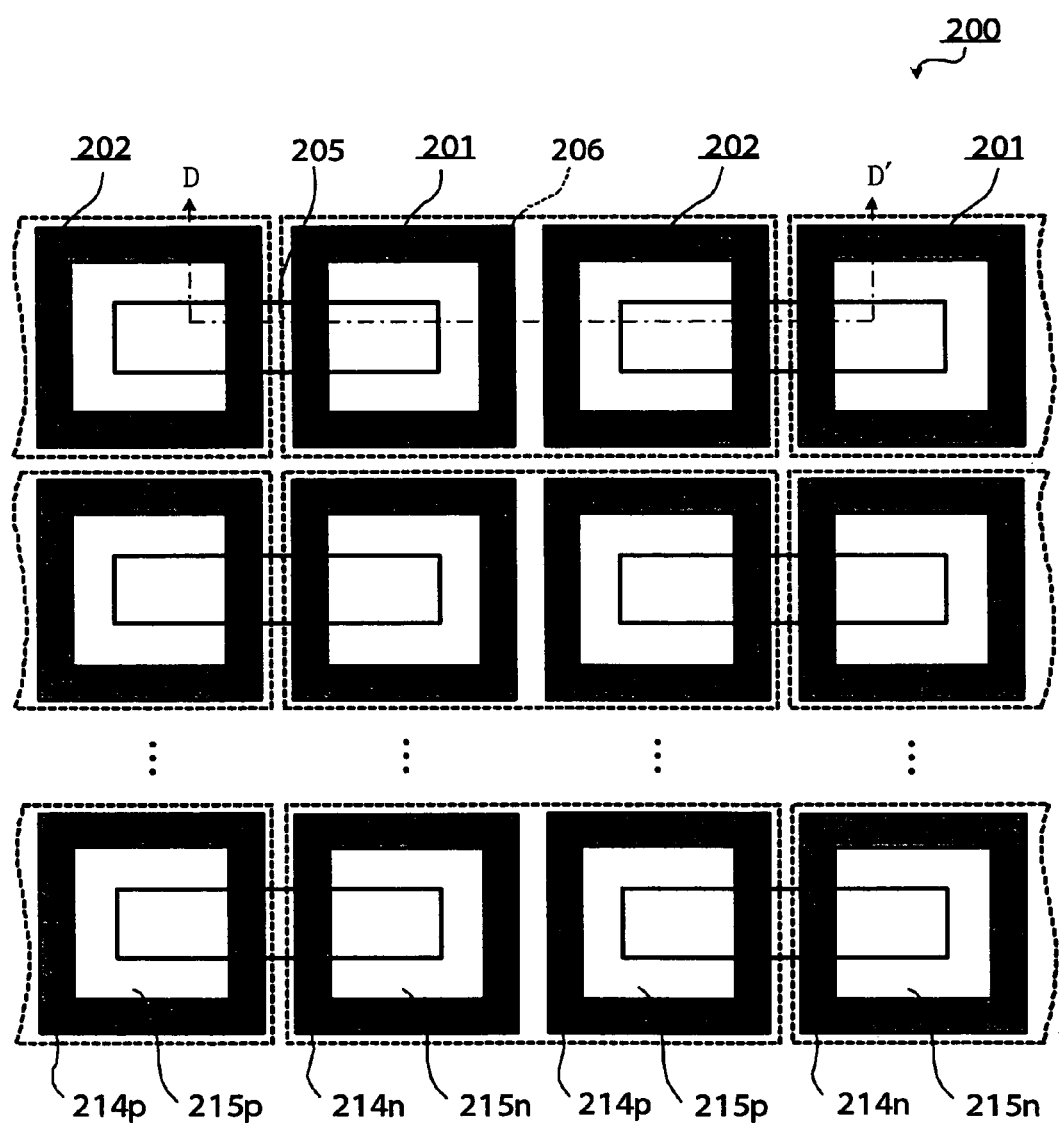
FIG. 7 is a plan view showing an example of the structure of a thermoelectric element according to a fifth embodiment of the present invention.
Figure 8:
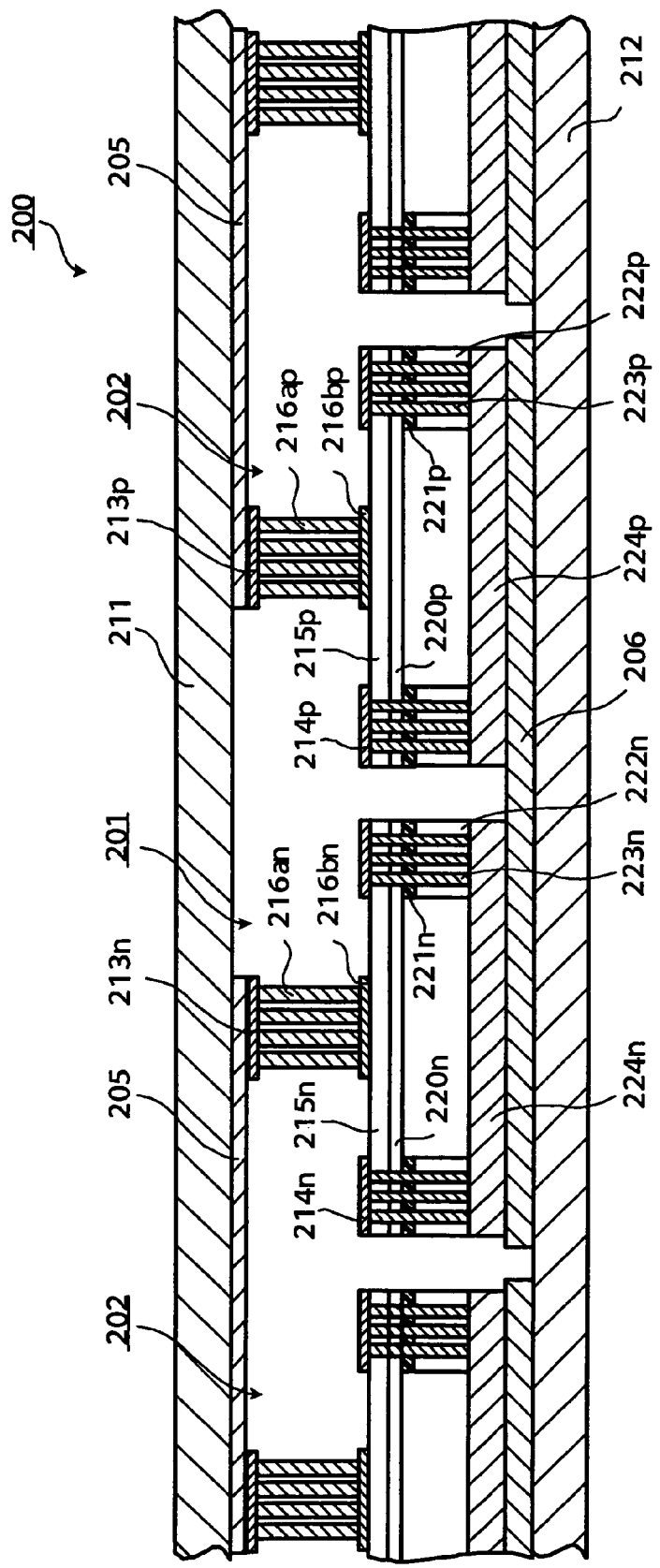
FIG. 8 is a cross sectional view of the thermoelectric element shown in FIG. 7 as taken along a line D-D'.

A thermoelectric element 200 according to the fifth embodiment of the present invention is shown in FIG. 7 and FIG. 8. FIG. 7 is a plan view of the thermoelectric element 200, and FIG. 8 is a cross sectional view of FIG. 7 as taken along a line D-D'. The explanation will be given by employing, as an example a case where a thermoelectric cell to constitute the thermoelectric element 200 is made from the thermoelectric element 100 according to the fourth embodiment, from which the first substrate 111 and the second substrate 112 are removed.

The thermoelectric element 200 according to the present embodiment comprises N type thermoelectric cells 201 including a thermoelectric material 215n made of an N type superlattice thermoelectric material, and P type thermoelectric cells 202 including a thermoelectric material 215p made of a P type superlattice thermoelectric material.

The thermoelectric element 200 comprises a plurality of N type thermoelectric cells 201 and P type thermoelectric cells 202. As shown in FIG. 7, the N type thermoelectric cells 201 and the P type thermoelectric cells 202 are arranged alternately in the row direction, and they are arranged in a matrix as a whole with such rows formed plurally.

As shown in FIG. 8, the N type thermoelectric cell 201 comprises a first electrode 213n, a second electrode 214n, a thermoelectric material 215n made of an N type superlattice thermoelectric material, a stress releasing section 216n, an SG layer 220n, an insulating layer 221n, a silicon layer 222n, penetrating electrodes 223n, and a lower electrode 224n.

As shown in FIG. 8, likewise the N type thermoelectric cell 201, the P type thermoelectric cell 202 comprises a first electrode 213p, a second electrode 214p, a thermoelectric material 215p made of a P type superlattice thermoelectric material, a stress releasing section 216p, an SG layer 220p, an insulating layer 221p, a silicon layer 222p, penetrating electrodes 223p, and a lower electrode 224p. The plurality of N type thermoelectric cells 201 and the plurality of P type thermoelectric cells 202 are formed between a first substrate 211 and a second substrate 212.

The N type thermoelectric cells 201 and the P type thermoelectric cells 202 are electrically connected to each other via third electrodes 205 formed on the lower surface of the first substrate 211 and fourth electrodes 206 formed on the upper surface of the second substrate 212. Specifically, the first electrode 213n of the N type thermoelectric cell 201 is electrically connected, via the third electrode 205, to the first electrode 213p of the P type thermoelectric cell 202 which is adjacent to one end (the left end in FIG. 8) of the N type thermoelectric cell 201. The lower electrode 224n of the N type thermoelectric cell 201 is electrically connected, via the fourth electrode 206, to the lower electrode 224p of the P type thermoelectric cell 202 which is adjacent to the other end (the right end in FIG. 8) of the N type thermoelectric cell 201. The third electrodes 205 and the fourth electrode 206 are formed into a generally rectangular shape as shown in FIG. 7.

By electrically connecting adjacent N type thermoelectric cells 201 and P type thermoelectric cells 202 by the third electrodes 205 and fourth electrodes 206, it is possible to connect a plurality of thermoelectric cells in series with a simple structure. In this case, the fourth electrodes 206 at both ends of the series connection are connected to an external electrode (unillustrated) for outputting the electricity.

The plan-view shape of the third electrodes 205 and fourth electrodes 206 is not limited to a general rectangle, as long as they can electrically connect adjacent N type thermoelectric cells 201 and P type thermoelectric cells 202. Further, the N type thermoelectric cells 201 and the P type thermoelectric cells 202 may not only be connected in line in the row direction as shown in FIG. 7, but may be connected in the column direction or may be connected in both the row direction and the column direction. Further, in a case where adjacent N type thermoelectric cells 201 themselves, and adjacent P type thermoelectric cells 202 themselves are connected in parallel, it is also possible to, for example, integrally form the silicon layer 222n of the N type thermoelectric cells 201 between themselves, and the silicon layer 222p of the P type thermoelectric cells 202 between themselves. By integrally forming the silicon layer 222n and the silicon layer 222p between the adjacent cells of the same type, it is possible to reduce the manufacturing cost of the thermoelectric element.

(Sixth Embodiment)

Figure 9:
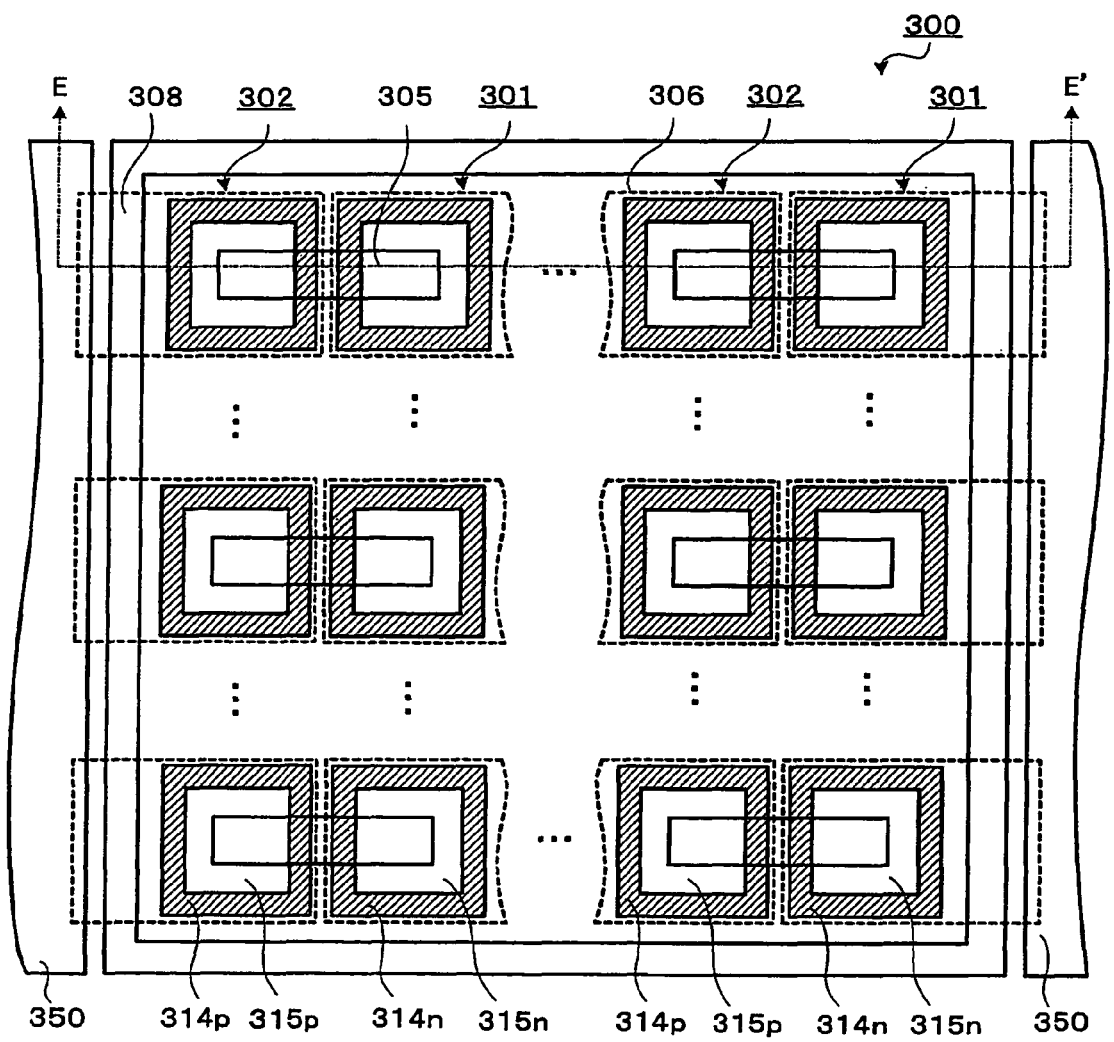
FIG. 9 is a plan view showing an example of the structure of a thermoelectric element according to a sixth embodiment of the present invention.
Figure 10:
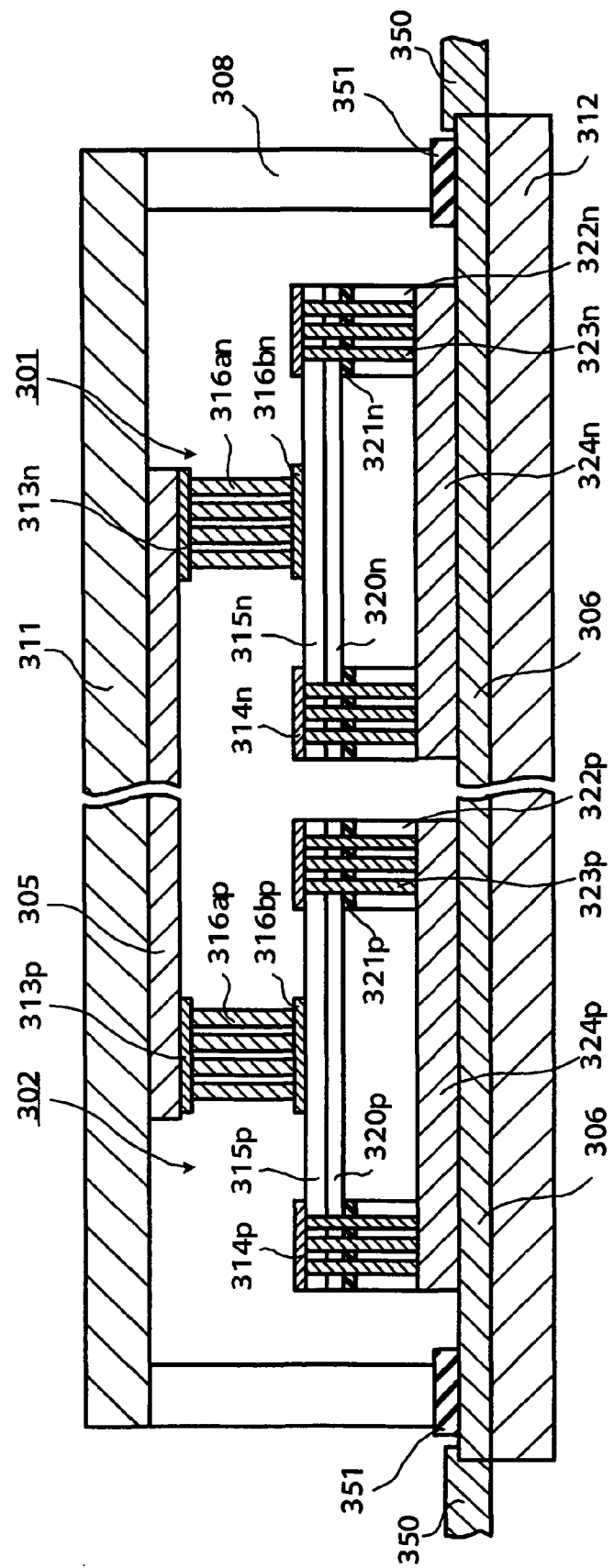
FIG. 10 is a cross sectional view of the thermoelectric element shown in FIG. 9 as taken along a line E-E'.

A thermoelectric element 300 according to the sixth embodiment of the present invention is shown in FIG. 9 and FIG. 10. The thermoelectric element 300 according to the present embodiment is different from the thermoelectric elements according to the other embodiments in that the cells constituting the thermoelectric element 300 are sealed by a sealing section. Explanation will be given by employing, as an example, a case where the thermoelectric cells constituting the thermoelectric element 300 have the same structure as the thermoelectric element 200 according to the fifth embodiment.

The thermoelectric element 300 according to the present embodiment comprises N type thermoelectric cells 301 including a thermoelectric material 315n made of an N type superlattice thermoelectric material, P type thermoelectric cells 302 including a thermoelectric element 315p made of a P type superlattice thermoelectric material, and a sealing section 308 provided between a first substrate 311 and a second substrate 312.

The thermoelectric element 300 comprises a plurality of N type thermoelectric cells 301 and P type thermoelectric cells 302. As shown in FIG. 9, the N type thermoelectric cells 301 and the P type thermoelectric cells 302 are arranged alternately in the row direction, and they are arranged in a matrix as a whole with such rows formed plurally.

As shown in FIG. 10, the N type thermoelectric cell 301 comprises a first electrode 313n, a second electrode 314n, a thermoelectric material 315n, a stress releasing section 316n, an SG layer 320n, an insulating layer 321n, a silicon layer 322n, penetrating electrodes 323n, and a lower electrode 324n.

Likewise the N type thermoelectric cell 301, as shown in FIG. 10, the P type thermoelectric cell 302 comprises a first electrode 313p, a second electrode 314p, a thermoelectric material 315p, a stress releasing section 316p, an SG layer 320p, an insulating layer 321p, a silicon layer 322p, penetrating electrodes 323p, and a lower electrode 324p.

The plurality of N type thermoelectric cells 301 and the plurality of P type thermoelectric cells 302 are placed between the first substrate 311 and the second substrate 312. The N type thermoelectric cells 301 and the P type thermoelectric cells 302 are electrically connected to each other in series, via third electrodes 305 formed on the lower surface of the first substrate 311 and fourth electrodes 306 formed on the upper surface of the second substrate 312, as shown in FIG. 10. The fourth electrodes 306 at both ends of the series connection are connected to external electrodes 305 for outputting electricity.

Further, according to the present embodiment, the sealing section 308 is provided between the first substrate 311 and the second substrate 312. The sealing section 308 is made of a material having superelasticity, specifically, made of, for example, alloy comprising titanium. The space formed by the sealing section 308, the first substrate 311, and the second substrate 312, i.e., the space in which the N type thermoelectric cells 301 and the P type thermoelectric cells 302 are placed can be kept to a vacuum state by the sealing section 308. Further, particularly, by forming the sealing section 308 by using a material having superelasticity, it is possible to prevent cracks from being produced in the sealing section 308 due to deformation, etc. caused by a stress, and maintain the space in which the N type thermoelectric cells 301 and the P type thermoelectric cells 302 are placed favorably to a vacuum state. The first substrate 311 and the sealing section 308 may be formed integrally from the same material. In a case where the sealing section 308 is made of a material having conductivity, such as superelastic metal, etc., an insulating layer 351 for insulating the fourth electrodes 306 and the sealing section 308 from each other is formed between the fourth electrodes 306 which are connected to the external electrodes 350, and the sealing section 308.

(Seventh Embodiment)

Figure 11:
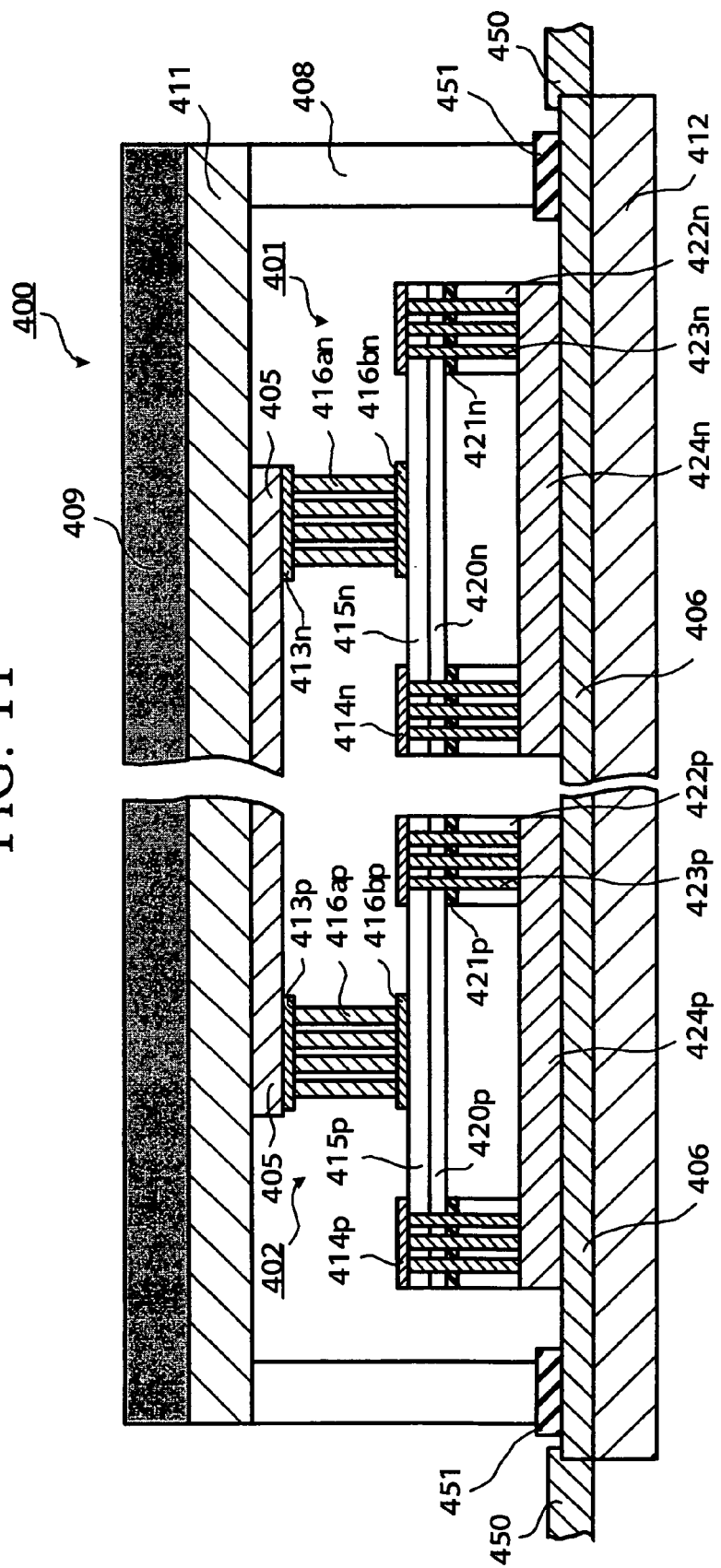
FIG. 11 is a cross sectional view showing an example of the structure of a thermoelectric element according to a seventh embodiment of the present invention.

A thermoelectric element 400 according to the seventh embodiment of the present invention is shown in FIG. 11.

The thermoelectric element 400 according to the present embodiment comprises a stress releasing layer, which is placed on a first substrate, or a substrate on the high temperature side. Explanation will be given by employing, as an example, a case where the structure of the thermoelectric cells constituting the thermoelectric element 400 and the arrangement of the cells are the same as those of the thermoelectric element 300 according to the sixth embodiment.

The thermoelectric element 400 comprises N type thermoelectric cells 401, P type thermoelectric cells 402, and a sealing section 408 likewise the thermoelectric element 300 according to the sixth embodiment, and further a stress releasing layer 409 as a difference from the thermoelectric element 300.

As shown in FIG. 11, the N type thermoelectric cell 401 comprises a first electrode 413n, a second electrode 414n, a thermoelectric material 415n, a stress releasing section 416n, an SG layer 420n, an insulating layer 421n, a silicon layer 422n, penetrating electrodes 423n, and a lower electrode 424n. Likewise the N type thermoelectric cell 401, the P type thermoelectric cell 402 comprises a first electrode 413p, a second electrode 414p, a thermoelectric material 415p, a stress releasing section 416p, an SG layer 420p, an insulating layer 421p, a silicon layer 422p, penetrating electrodes 423p, and a lower electrode 424p. The plurality of N type thermoelectric cells 401 and the plurality of P type thermoelectric cells 402 are placed between a first substrate 411 and a second substrate 412, and electrically connected to each other in series via third electrodes 405 formed on the lower surface of the first substrate 411 and fourth electrodes 406 formed on the second substrate 412 as shown in FIG. 11. The fourth electrodes 406 at both ends of the series connection are connected to external electrodes 450 for outputting electricity. The space between the first substrate 411 and the second substrate 412 is sealed by the sealing section 408. In a case where the sealing section 408 is made of a material having conductivity such as superelastic metal, etc., an insulating layer 451 for insulating the fourth electrodes 406 and the sealing section 408 from each other is formed between the fourth electrodes 406 which are connected to the external electrodes 450, and the sealing section 408.

The stress releasing layer 409 is placed on the first substrate 411. The stress releasing layer 409 is preferably made of a material having a high heat conductance so that heat may be favorably conducted to the first substrate 411, and also having flexibility so that displacements that might occur to the first substrate 411, etc. due to a high temperature heat source may be absorbed, and made of, for example, carbon nanotube which is vertically aligned. It is preferred that single wall carbon nanotube be used as carbon nanotube.

The stress releasing layer 409 may be made of a complex material in which two or more materials are combined. In a case where the stress releasing layer 409 is made of a complex material, it is preferred that the portion of the stress releasing layer 409 that is on the side of the first substrate 411 be made of the same material as that of the first substrate 411 or a material having a linear coefficient of expansion which is similar to that of the first substrate 411. It is preferred that the portion of the stress releasing layer 409 that is on the side of the heat source be made of the same material as that of the heat source or a material having a linear coefficient of expansion which is similar to that of the heat source. Further, it is further preferred if the mixing ratio of these materials should be continually shifted from the side of the first substrate 411 toward the side of the heat source, because it becomes possible to favorably prevent occurrence of cracks etc. due to the difference in linear coefficient of expansion.

By forming the stress releasing layer 409 on the first substrate 411, it is possible to prevent occurrence of defects such as cracks that might be produced in the N type thermoelectric cells 401, the P type thermoelectric cells 402, or the like, that constitute the thermoelectric element 400, even in a case where displacements occur to the first substrate 411, etc. due to the high temperature heat source.

The stress releasing layer may not only be formed on the first substrate 411, but may be formed on the second substrate 412 as a stress releasing layer 410, or may be formed on both the first substrate 411 and the second substrate 412.

(Eight Embodiment)

A thermoelectric element 500 according to the eighth embodiment of the present invention will be explained by using the diagrams. The thermoelectric element 500 according to the present embodiment is characterized in that it comprises a heat collecting plate 503 and/or a heat radiating plate 504. The other components of the thermoelectric element 500 will be explained by employing, as an example, those of the thermoelectric element 300 according to the sixth embodiment.

Figure 12:
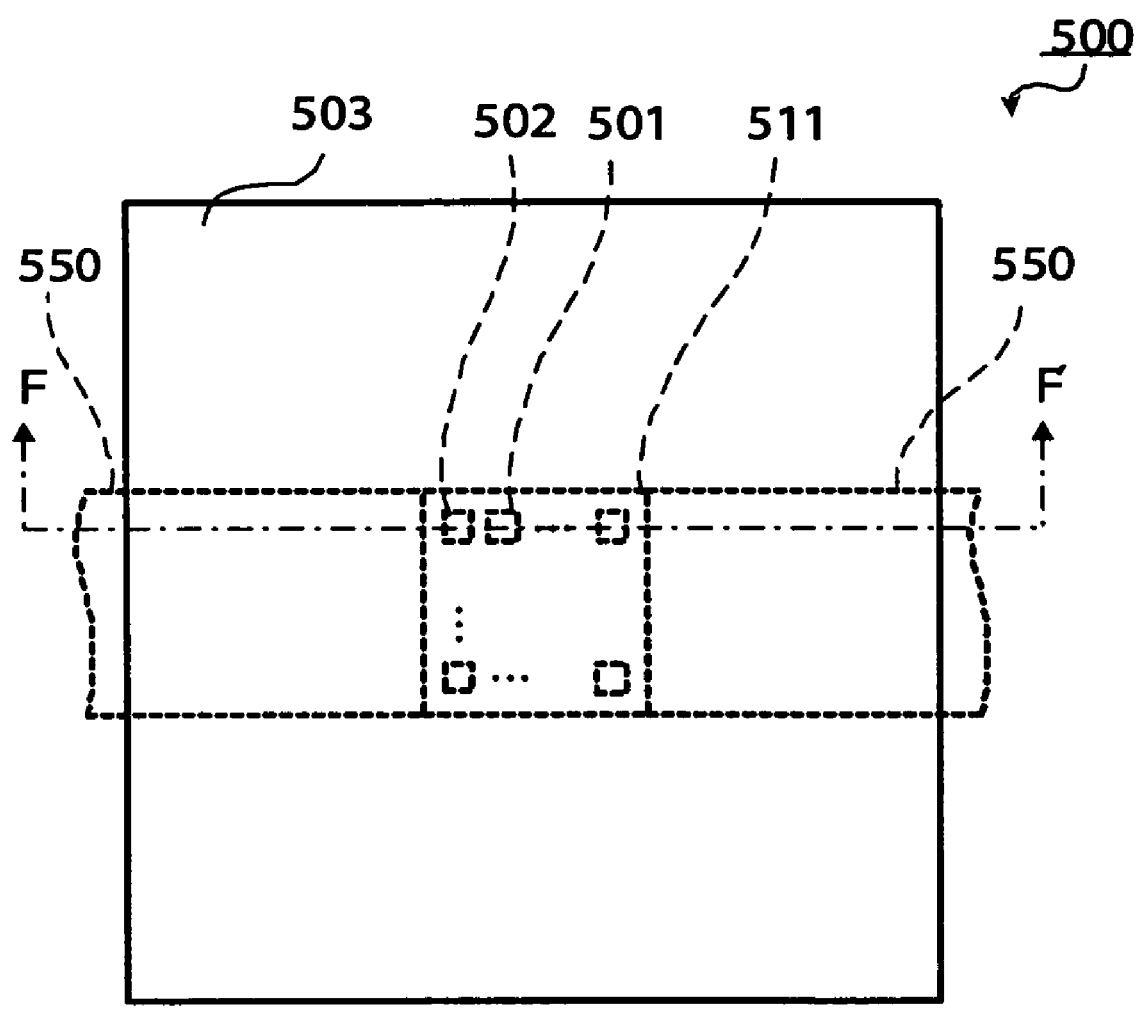
FIG. 12 is a plan view showing an example of the structure of a thermoelectric element according to an eighth embodiment of the present invention.
Figure 13:
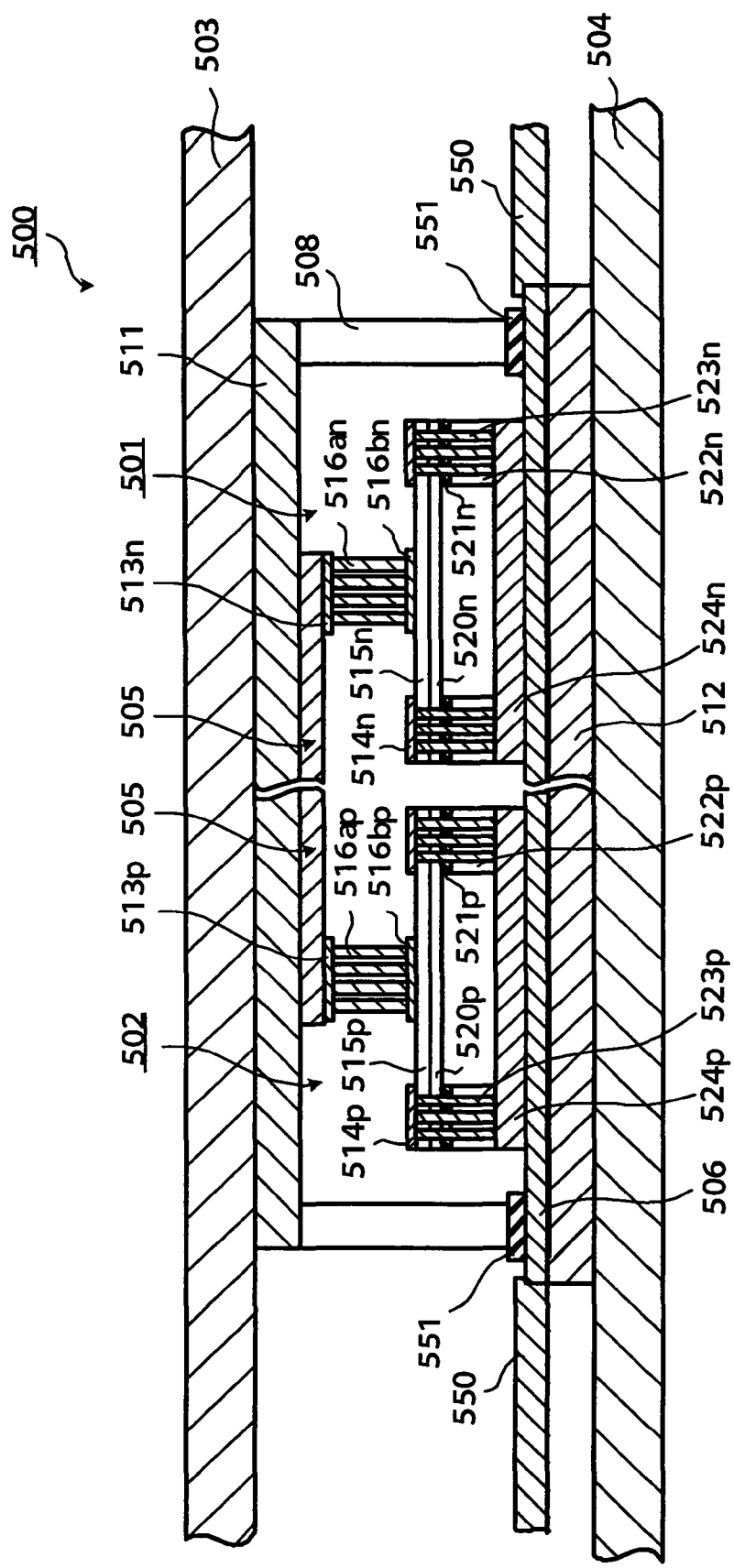
FIG. 13 is a cross sectional view of the thermoelectric element shown in FIG. 12 as taken along a line F-F'.

As shown in FIG. 12 and FIG. 13, the thermoelectric element 500 comprises a first substrate 511, a second substrate 512, an N type thermoelectric cell 501, a P type thermoelectric cell 502, a heat collecting plate 503, and/or a heat radiating plate 504, and a sealing section 508.

As shown in FIG. 13, an N type thermoelectric cell 501 comprises a first electrode 513*n*, a second electrode 514*n*, a thermoelectric material 515*n*, a stress releasing section 516*n*, an SG layer 520*n*, an insulating layer 521*n*, a silicon layer 522*n*, penetrating electrodes 523*n*, and a lower electrode 524*n*. Likewise the N type thermoelectric cell 501, a P type thermoelectric cell 502 comprises a first electrode 513*p*, a second electrode 514*p*, a thermoelectric material 515*p*, a stress releasing section 516*p*, an SG layer 520*p*, an insulating layer 521*p*, a silicon layer 522*p*, penetrating electrodes 523*p*, and a lower electrode 524*p*. A plurality of N type thermoelectric cells 501 and a plurality of P type thermoelectric cells 502 are placed between the first substrate 511 and the second substrate 512. As shown in FIG. 13, the N type thermoelectric cells 501 and the P type thermoelectric cells 502 are electrically connected to each other in series, via third electrodes 505 formed on the lower surface of the first substrate 511 and fourth electrodes 506 formed on the upper surface of the second substrate 512. The fourth electrodes 506 on both ends of the series connection are connected to external electrodes 550 for outputting electricity. The space between the first substrate 511 and the second substrate 512 is sealed by the sealing section 508. In a case where the sealing section 508 is made of a material having conductivity such as superelastic metal, etc., an insulating layer 551 for insulating the fourth electrodes 506 and the sealing section 508 is formed between the fourth electrodes 506 which are formed to the external electrodes 550, and the sealing section 508.

The heat collecting plate 503 is placed on the first substrate 511. The heat collecting plate 503 is preferably made of a material having a high heat conductance, in order to collect heat from a high temperature section placed at the side of the first substrate 511. Further, since the thermo-electromotive force generated in the thermoelectric material 515 becomes larger as the thermal insulation between the heat collecting plate 503 and the high temperature section is smaller, it is preferred that the heat collecting plate 503 be formed to have a sufficiently larger area than that of the first substrate 511. The heat radiating plate 504 is placed on the second substrate 512. The heat radiating plate 504 is preferably made of a material having a high heat conductance, in order to radiate heat to a low temperature section placed at the side of the second substrate 512. Further, since the thermo-electromotive force generated in the thermoelectric material 515 becomes larger as the thermal insulation between the heat radiating plate 504 and the low temperature section is smaller, it is preferred that the heat radiating plate 504 be formed to have a sufficiently larger area than that of the second substrate 512.

Figure 14:
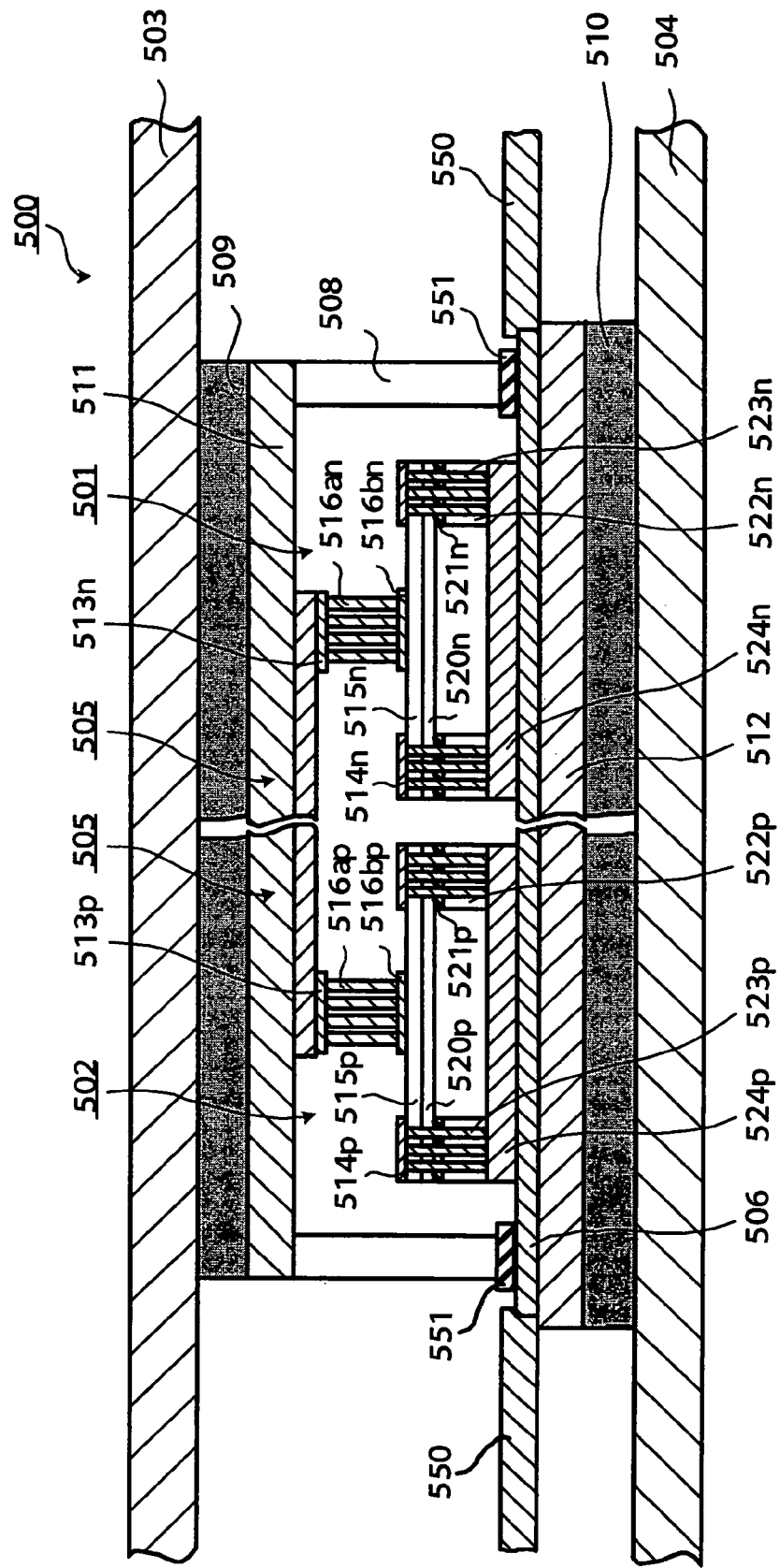
FIG. 14 is a cross sectional view showing a modified example of the thermoelectric element according to the eighth embodiment of the present invention.

Provided with the heat collecting plate 503 and/or the heat radiating plate 504 as shown in FIG. 14, the thermoelectric element 500 according to the present embodiment can favorably obtain the thermo-electromotive force generated in the thermoelectric material 515.

A stress releasing layer 509 equivalent to that explained in the seventh embodiment of the present invention may be inserted between the first substrate 511 and the heat collecting plate 503. Likewise, a stress releasing layer 510 equivalent to that explained in the seventh embodiment of the present invention may be inserted between the second substrate 512 and the heat radiating plate 504. This will release any stress that may be applied to the junction between the first substrate 511 and the heat collecting plate 503, and between the second substrate 512 and the heat radiating plate 504. Further, in a case where, for example, an organic adhesive material having adhesiveness is applied on the surface of the stress releasing layer 510 equivalent to that explained in the seventh embodiment of the present invention, which may be inserted between the second substrate 512 and the heat radiating plate 504, it becomes easy to join the second substrate 512 and the heat radiating plate 504. Since this makes it easier to separately assemble the member including the second substrate 512 and the member including the heat radiating plate 504 and then join them at the junction between the second substrate 512 and the heat radiating plate 504, it is possible to reduce the assembly cost. It is also possible to form only either the stress releasing layer 509 or 510.

The present invention is not limited to the above-described embodiments, but may be modified or applied in various manners.

For example, according to the first embodiment, explanation has been given by employing, as an example, a case where the columnar portions 16*a* of the stress releasing section 16 are arranged at five locations along the center line X. This is not the only case, but they may be formed at less than five locations, or more than five locations. The stress releasing section 16 may not only be formed into a columnar shape, but may be formed into a belt shape or a plate shape. These matters can be arbitrarily adjusted depending on the performance, etc. required of the thermoelectric element 10.

According to the respective embodiments described above, explanation has been given by employing, as an example, a case where the first substrate is at the high temperature side and the second substrate is at the low temperature side. This is not the only case, but the first substrate may be placed at the low temperature side and the second substrate at the high temperature side.

Further, according to the respective embodiments described above, employed is such a mode for generating a thermo-electromotive force between the low temperature end and the high temperature end of a thermoelectric semiconductor by a thermoelectric effect by utilizing Seebeck effect. Specifically, taking the thermoelectric element 10 according to the first embodiment as an example, it produces a temperature gradient in its thermoelectric material 15 with its first substrate 11 shown in FIG. 2, 4, or 5 heated and with its second substrate 12 shown in FIG. 2, 4, or 5 cooled, and generates a thermo-electromotive force between the low temperature end and high temperature end of the thermoelectric material 15 by a thermoelectric effect. However, this is not the only case, but it is also possible to generate a temperature gradient in a thermoelectric element by supplying electricity from outside, by utilizing Peltier effect. For example, taking the thermoelectric element 10 according to the first embodiment as an example, it may also be embodied to flow an electric current through the thermoelectric material 15 by a voltage being applied across the first electrode 13 and the second electrode 14, thereby to generate a temperature gradient in the thermoelectric material 15 to lower the temperature of the first substrate 11 and raise the temperature of the second substrate 12. Further, the temperature of the first substrate 11 may be raised and the temperature of the second substrate 12 may be lowered, by reversing the direction of the electric current.

Figure 15:
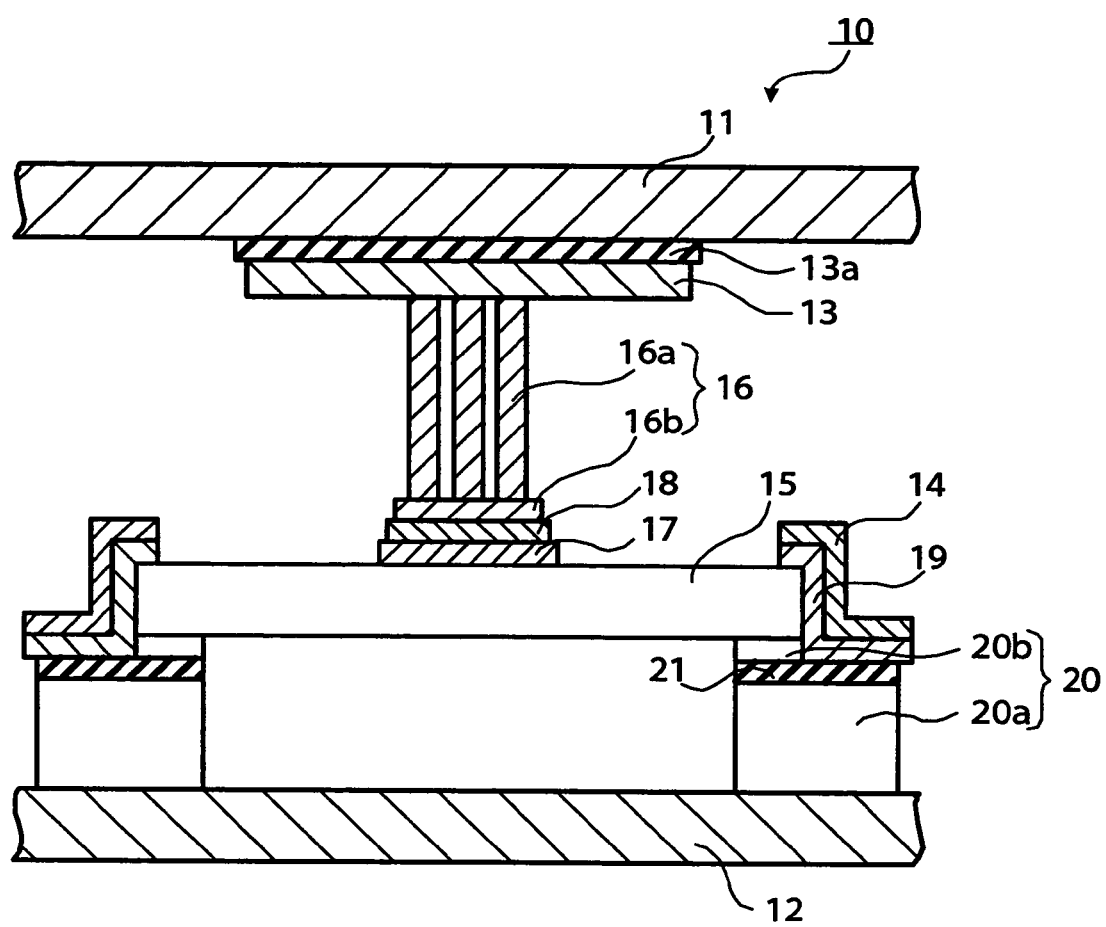
FIG. 15 is a cross sectional view of the thermoelectric element shown in FIG. 1 as taken along the line A-A' according to another embodiment.

According to the first embodiment, the thermoelectric element 10 may comprise an emitter section 17, an energy barrier section 18, and a collector section 19 as shown in FIG. 15.

The emitter section 17 is made of a conductive material, and made of semiconductor in which an N type impurity such as phosphorus, etc. is diffused, provided that N type semiconductor is used. The emitter section 17 is formed to have a higher impurity concentration and a larger work function than those of the collector section 19. The stress releasing section 16 is formed between the emitter section 17 and the first electrode 13.

The energy barrier section 18 is made of semiconductor or insulator that has a larger band gap than that of the thermoelectric material 15, and formed between the emitter section 17 and the stress releasing section 16 as shown in FIG. 15. An energy barrier is produced between the emitter section 17 and the energy barrier section 18, so that electrons having energy of a predetermined level or higher may only pass through the energy barrier section 18 to flow from the emitter section 17 into the thermoelectric material 15, thereby enabling the thermo-electromotive force of the thermoelectric material 15 to be raised. Since an energy barrier is also produced between the thermoelectric material 15 and the energy barrier section 18 because of a difference in band gap, electrons can be prevented from flowing from the thermoelectric material 15 toward the energy barrier section 18.

The collector section 19 is made of a material having a small work function such as, for example, Li, Mg, Al, or Ag, or alloy containing these. The collector section 19 is formed to have a small work function unlike the emitter section 17. The collector section 19 and the second electrode 14 constitutes the Schottky contact and can prevent electrons from flowing from the second electrode 14 to the collector section 19. The collector section 19 is formed on both ends of the thermoelectric material 15, and the silicon layer 20 is formed at both ends where the collector section 19 is formed.

In this manner, the thermoelectric element 10 can obtain a favorable thermo-electromotive force, with only such electrons as having energy of a predetermined level or higher flowing into the thermoelectric material 15 through the energy barrier section 18 made of metal oxide or the like.

Though it has been explained that the emitter section 17 is made of an N type semiconductor region and the energy barrier section 18 is made of metal oxide, this is not the only case but the emitter section 17 may be made of metal. Further, the energy barrier section 18 may be made of a semiconductor region, insulator, or the like that has a low impurity concentration and a band gap of a predetermined level.

Instead of the energy barrier section 18, etc., a semiconductor layer having a low impurity concentration may be formed between the first electrode 13 and the thermoelectric material 15.

The energy barrier section 18 may be omitted, and the emitter section 17 and the collector section 19 may be made of a metal material which would provide the Ohmic contact between them. These matters can be arbitrarily changed depending on the characteristics required of the thermoelectric element 10.

Figure 16:
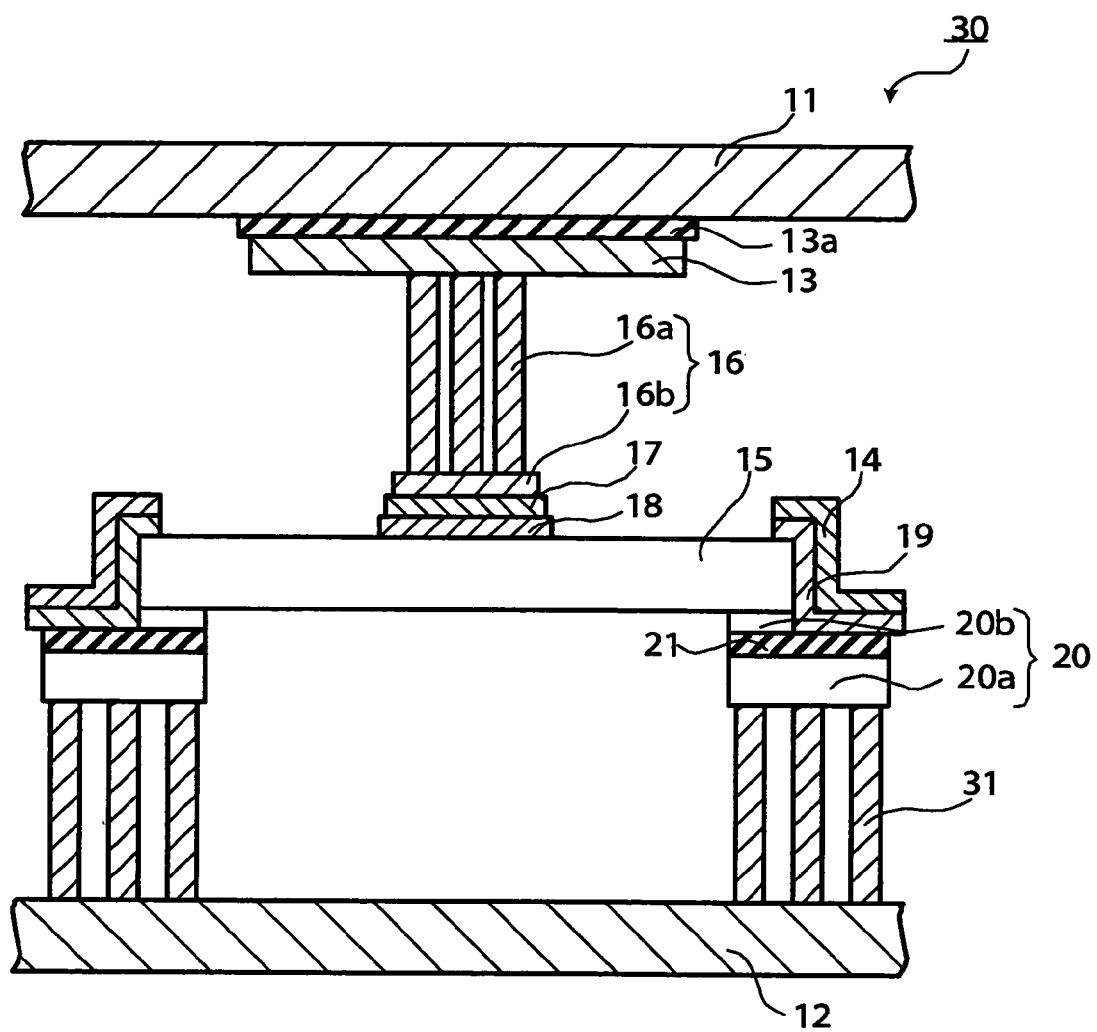
FIG. 16 is a cross sectional view of the thermoelectric element shown in FIG. 3 as taken along the line B-B' according to another embodiment.

Likewise in the first embodiment, the thermoelectric element 10 may comprise the emitter section 17, the energy barrier section 18, and the collector section 19 in the second and third embodiments. As shown in FIG. 16, the second stress releasing section 31 is formed between the second substrate 12 and the silicon layer 20 at both ends of the thermoelectric material 15 at which the collector section 19 is formed. A part of the third stress releasing section 51 is formed between the collector section 19 and the second electrode 54.

Various embodiments and changes may be made thereunto without departing from the broad spirit and scope of the invention. The above-described embodiments are intended to illustrate the present invention, not to limit the scope of the present invention.

The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-278097 filed on Sep. 26, 2005 and Japanese Patent Application No. 2006-174221 filed on Jun. 23, 2006 and including specification, claims, drawings and summary. The disclosures of the above Japanese Patent Applications are incorporated herein by reference in their entirety.

What is claimed is:

1. A thermoelectric element, comprising:
a first substrate;
a second substrate facing said first substrate;
a thermoelectric material as a thin film placed between said first substrate and said second substrate and generating a thermo-electromotive force by a temperature gradient in a lateral direction of said thermoelectric thin film;
a first electrode electrically connected to a high temperature portion of said thermoelectric film;
a second electrode electrically connected to a low temperature portion of said thermoelectric thin film;
one or more first stress mitigating sections having flexibility and electrical conductivity, wherein each of the one or more first stress mitigating sections thermally and electrically connects said first electrode at a first end of each of the one or more first stress mitigating sections and said thermoelectric thin film at a second end of the one or more first stress mitigating sections via an electrically conductive flat portion composed by a part of said first stress mitigating section, and the electrically conductive flat portion is substantially parallel with a surface of said thermoelectric thin film;

said thermoelectric thin film placed on said second substrate via a spacer so that the second substrate and said thermoelectric thin film are substantially in parallel with each other; and said second electrode and said conductive flat portion do not overlap with each other as viewed from a direction perpendicular to the surface of said thermoelectric thin film.

2. A thermoelectric element, comprising:

a first substrate;

a second substrate facing said first substrate;

a thermoelectric material being formed as a thin film placed between said first substrate and said second substrate and generating a thermo-electromotive force by a temperature gradient in a lateral direction of said thermoelectric thin film;

a first electrode electrically connected to a low temperature portion of said thermoelectric film;

a second electrode electrically connected to a high temperature portion of said thermoelectric thin film;

one or more stress mitigating sections having flexibility and electrical conductivity, wherein each of the one or more stress mitigating sections thermally and electrically connects said first electrode at a first end of each of the one or more stress mitigating sections and said thermoelectric thin film at a second end of the one or more stress mitigating sections via an electrically conductive flat portion composed by a part of said stress mitigating section, and the electrically conductive flat portion is substantially parallel with a surface of said thermoelectric thin film;

said thermoelectric thin film placed on said second substrate via a spacer so that the second substrate and said thermoelectric thin film are substantially in parallel with each other; and said second electrode and said conductive flat portion do not overlap with each other as viewed from a direction perpendicular to the surface of said thermoelectric thin film.

3. A thermoelectric element, comprising:

a first substrate;

a second substrate facing said first substrate;

a thermoelectric material being formed as a thin film placed between said first substrate and said second substrate and generating heat transfer by an electric current in a lateral direction of said thermoelectric thin film;

a first electrode electrically connected to a heat absorbing portion of said thermoelectric film;

a second electrode electrically connected to a heat generating portion of said thermoelectric thin film;

one or more stress mitigating sections having flexibility and electrical conductivity, wherein each of the one or more stress mitigating sections thermally and electrically connects said first electrode at a first end of each of the one or more stress mitigating sections and said thermoelectric thin film at a second end of the one or more stress mitigating sections via an electrically conductive flat portion composed by a part of said stress mitigating section, and the electrically conductive flat portion is substantially parallel with a surface of said thermoelectric thin film;

said thermoelectric thin film placed on said second substrate via a spacer so that the second substrate and said thermoelectric thin film are substantially in parallel with each other; and said second electrode and said conductive flat portion do not overlap with each other as viewed from a direction perpendicular to the surface of said thermoelectric thin film.

4. A thermoelectric element, comprising:

a first substrate;

a second substrate facing said first substrate;

a thermoelectric material being formed as a thin film placed between said first substrate and said second substrate and generating heat transfer by an electric current in a lateral direction of said thermoelectric thin film;

a first electrode electrically connected to a heat generating portion of said thermoelectric film;

a second electrode electrically connected to a heat absorbing portion of said thermoelectric thin film;

one or more stress mitigating sections having flexibility and electrical conductivity, wherein each of the one or more stress mitigating sections thermally and electrically connects said first electrode at a first end of each of the one or more stress mitigating sections and said thermoelectric thin film at a second end of the one or more stress mitigating sections via an electrically conductive flat portion composed by a part of said stress mitigating section, and the electrically conductive flat portion is substantially parallel with a surface of said thermoelectric thin film;

said thermoelectric thin film placed on said second substrate via a spacer so that the second substrate and said thermoelectric thin film are substantially in parallel with each other; and said second electrode and said conductive flat portion do not overlap with each other as viewed from a direction perpendicular to the surface of said thermoelectric thin film.

5. A thermoelectric element, comprising:

a first substrate;

a second substrate facing said first substrate;

a thermoelectric material being formed as a thin film placed between said first substrate and said second substrate and generating a thermo-electromotive force by a temperature gradient in a lateral direction of said thermoelectric thin film;

a first electrode formed on a surface of said first substrate that faces said second substrate;

a second electrode electrically connected to said thermoelectric thin film and electrically connected to said first electrode via said thermoelectric thin film;

a stress mitigating section having flexibility and electrical conductivity and comprising at least one or more columnar portions formed between said first electrode and said thermoelectric thin film, wherein the stress mitigating section electrically and thermally connects said first electrode at a first end of the stress mitigating section and said thermoelectric thin film at a second end of the stress mitigating section via an electrically conductive flat portion composed by a part of said stress mitigating section, and the electrically conductive flat portion is substantially parallel with a surface of said thermoelectric thin film;

said thermoelectric thin film placed on said second substrate via a spacer so that the second substrate and said thermoelectric thin film are substantially in parallel with each other; and said second electrode and said conductive flat portion do not overlap with each other as viewed from a direction perpendicular to the surface of said thermoelectric thin film.

6. The thermoelectric element according to claim 5, further comprising:
   a supporter placed at a circumferential portion of said thermoelectric thin film for supporting said thermoelectric thin film; and
   said supporter is formed into a frame shape so as to be able to support said thermoelectric thin film.

7. The thermoelectric element according to claim 1, further comprising:
   a lower electrode is formed on said second substrate;
   said second electrode and said lower electrode are electrically connected.

8. The thermoelectric element according to claim 1, wherein said spacer is placed on said second substrate such that it is movable.

9. The thermoelectric element according to claim 7, wherein said spacer is formed into a frame shape, placed at a circumferential portion of said thermoelectric thin film, and supports said thermoelectric thin film as a supporter.

10. The thermoelectric element according to claim 1, wherein at least a part of said one or more first stress mitigating sections having flexibility is made of carbon nanotube.

11. The thermoelectric element according to claim 1, further comprising:
   one or more second stress mitigating sections having flexibility between said thermoelectric thin film and said second substrate.

12. The thermoelectric element according to claim 11, wherein at least one of said one or more first stress mitigating sections and said one or more second stress mitigating sections comprise a columnar portion.

13. The thermoelectric element according to claim 1, wherein said thermoelectric thin film comprises a plurality of N type and P type thermoelectric materials, said first electrode and said second electrode are connected to each of said N type and P type thermoelectric thin films, said N type thermoelectric thin films and said P type thermoelectric thin films are arranged alternately, and said first electrode is connected to one of said N type thermoelectric thin films and to one of said P type thermoelectric thin films adjacent to one end of said one of said N type thermoelectric thin films and said second electrode is connected to said one of said N type thermoelectric thin films and to one of said P type thermoelectric thin films adjacent to another end of said one of said N type thermoelectric thin films such that said N type thermoelectric thin films and said P type thermoelectric thin films are in series connection.

14. The thermoelectric element according to claim 1, further comprising:
   a sealing section which shields said thermoelectric thin film from external air, wherein the sealing section fixes the first substrate with respect to the second substrate.

15. The thermoelectric element according to claim 14, wherein said sealing section is made of a superelastic metal.

16. The thermoelectric element according to claim 1, further comprising:
   a heat collecting plate placed on said first substrate and/or said second substrate, and having a larger area than that of said thermoelectric thin film.

17. The thermoelectric element according to claim 16, further comprising:
   a stress mitigating section of the one or more first mitigating sections between said heat collecting plate placed on said first substrate and said first substrate, and/or a stress mitigating section of the one or more first mitigating sections between said heat collecting plate placed on said second substrate and said second substrate.

18. The thermoelectric element according to claim 17, wherein at least a part of said stress mitigating section is made of carbon nanotube.

19. A thermoelectric element, comprising:
   a first substrate;
   a second substrate facing said first substrate;
   a thermoelectric material being formed as a thin film placed between said first substrate and said second substrate and generating a thermo-electromotive force by a temperature gradient in a lateral direction of said thermoelectric thin film;
   a first electrode formed on said first substrate;
   a second electrode formed on said second substrate;
   said first electrode and said second electrode electrically connected to said thermoelectric thin film;
   said first substrate disposed closer to a high temperature side than said second substrate;
   one or more stress mitigating sections having flexibility and electrical conductivity, wherein each of the one or more stress mitigating sections thermally and electrically connects said first electrode at a first end of each of the one or more stress mitigating sections and said thermoelectric thin film at a second end of the one or more stress mitigating sections via an electrically conductive flat portion composed by a part of said stress mitigating section, and the electrically conductive flat portion is substantially parallel with a surface of said thermoelectric thin film;
   said one or more stress mitigation sections deforming in proportion to displacement of said first substrate to mitigate a stress acting upon said thermoelectric thin film;
   said thermoelectric thin film placed on said second substrate via a spacer so that the second substrate and said thermoelectric thin film are substantially in parallel with each other; and
   said second electrode and said conductive flat portion do not overlap with each other as viewed from a direction perpendicular to the surface of said thermoelectric thin film.

20. The thermoelectric element according to claim 1, wherein said one or more first stress mitigating sections are perpendicular to the surface of the thermoelectric thin film and generate a temperature difference in a lateral direction of said thermoelectric thin film.

21. The thermoelectric element according to claim 1, 2, 3, 4, 5, or 19, wherein said conductive flat portion is in contact with said thermoelectric thin film at an approximately middle portion between the first and second ends of the thermoelectric thin film and a cross-sectional view.

22. The thermoelectric element according to claim 1, 2, 3, 4, 5, or 19,
   wherein said spacer is in contact with said thermoelectric thin film at an opposite surface of the surface of said thermoelectric thin film in at least one region,
   wherein said conductive flat portion and the region in which the spacer is in contact with said thermoelectric thin film do not overlap with each other as viewed from a direction perpendicular to the surface of said thermoelectric thin film.

* * * * *